United States Patent
Lu et al.

(10) Patent No.: US 12,176,016 B2
(45) Date of Patent: *Dec. 24, 2024

(54) MEMORY DEVICE HAVING BITLINE SEGMENTED INTO BITLINE SEGMENTS AND RELATED METHOD FOR OPERATING MEMORY DEVICE

(71) Applicant: TAIWAN SEMICONDUCTOR MANUFACTURING COMPANY LTD., Hsinchu (TW)

(72) Inventors: Shih-Lien Linus Lu, Hsinchu (TW); Fong-Yuan Chang, Hsinchu County (TW); Yi-Chun Shih, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/472,282

(22) Filed: Sep. 22, 2023

(65) Prior Publication Data

US 2024/0013828 A1    Jan. 11, 2024

Related U.S. Application Data

(60) Continuation of application No. 17/733,785, filed on Apr. 29, 2022, now Pat. No. 11,817,139, which is a division of application No. 16/216,073, filed on Dec. 11, 2018, now Pat. No. 11,322,188.

(60) Provisional application No. 62/734,084, filed on Sep. 20, 2018.

(51) Int. Cl.
*G11C 7/02* (2006.01)
*G11C 11/00* (2006.01)
*G11C 11/16* (2006.01)
*H10B 61/00* (2023.01)
(Continued)

(52) U.S. Cl.
CPC ........ *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *H10B 61/20* (2023.02); *H10N 50/10* (2023.02); *H10N 50/80* (2023.02)

(58) Field of Classification Search
CPC .............. G11C 11/161; G11C 11/1655; G11C 11/1657; G11C 11/1659; G11C 11/1673; G11C 11/1675; G11C 11/5607; H10B 61/20; H10N 50/10; H10N 50/80
See application file for complete search history.

(56) References Cited

U.S. PATENT DOCUMENTS 11,817,139 B2 * 11/2023 Lu ...................... G11C 11/1659

* cited by examiner

*Primary Examiner* — Hien N Nguyen
(74) *Attorney, Agent, or Firm* — WPAT LAW; Anthony King

(57) ABSTRACT

A memory device includes a plurality of circuit layers, a plurality of first conductive through via structures and a plurality of bitlines. The circuit layers are disposed one above another, and each circuit layer includes one or more memory cell arrays. The first conductive through via structures penetrates though the circuit layers. Each of the bitlines includes a plurality of bitline segments disposed on the circuit layers respectively. The bitline segments are electrically connected through one of the first conductive through via structures. Each bitline segment is coupled to a plurality of memory cells of a memory cell array of a circuit layer where the bitline segment is disposed.

20 Claims, 12 Drawing Sheets

(51) Int. Cl.
*H10N 50/10* (2023.01)
*H10N 50/80* (2023.01)

MEMORY DEVICE HAVING BITLINE SEGMENTED INTO BITLINE SEGMENTS AND RELATED METHOD FOR OPERATING MEMORY DEVICE

PRIORITY CLAIM AND CROSS-REFERENCE

The present application is a continuation application of U.S. patent application Ser. No. 17/733,785 filed on Apr. 29, 2022, which is a divisional application of U.S. patent application Ser. No. 16/216,073 filed on Dec. 11, 2018, which claims priority to U.S. Provisional Patent Application No. 62/734,084 filed on Sep. 20, 2018, each of which is incorporated by reference herein in its entirety.

BACKGROUND

The present disclosure relates to memory devices, and more particularly, to a memory device having a bitline segmented into bitline segments and related magnetic random access memory (MRAM) device.

A magnetic random access memory (MRAM) device is an emerging memory device which has better potential in terms of scaling to smaller cell areas in comparison with a static random access memory (SRAM) device. The MRAM device uses magnetic tunnel junctions (MTJs) as magnetic memory cells. An MTJ includes two ferromagnetic layers separated by a tunneling barrier layer which is an insulator. One ferromagnetic layer is a fixed layer having a fixed magnetic moment direction, and the other is a free layer whose magnetic moment direction can be altered to change a resistance state of the MTJ between a parallel state (the two ferromagnetic layers have the same magnetic moment direction) and an anti-parallel state (the two ferromagnetic layers are in different magnetic moment directions). With the aid of tunneling magneto-resistance (TMR), the resistance state of the MTJ can be differentiated, thus making the MTJ a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
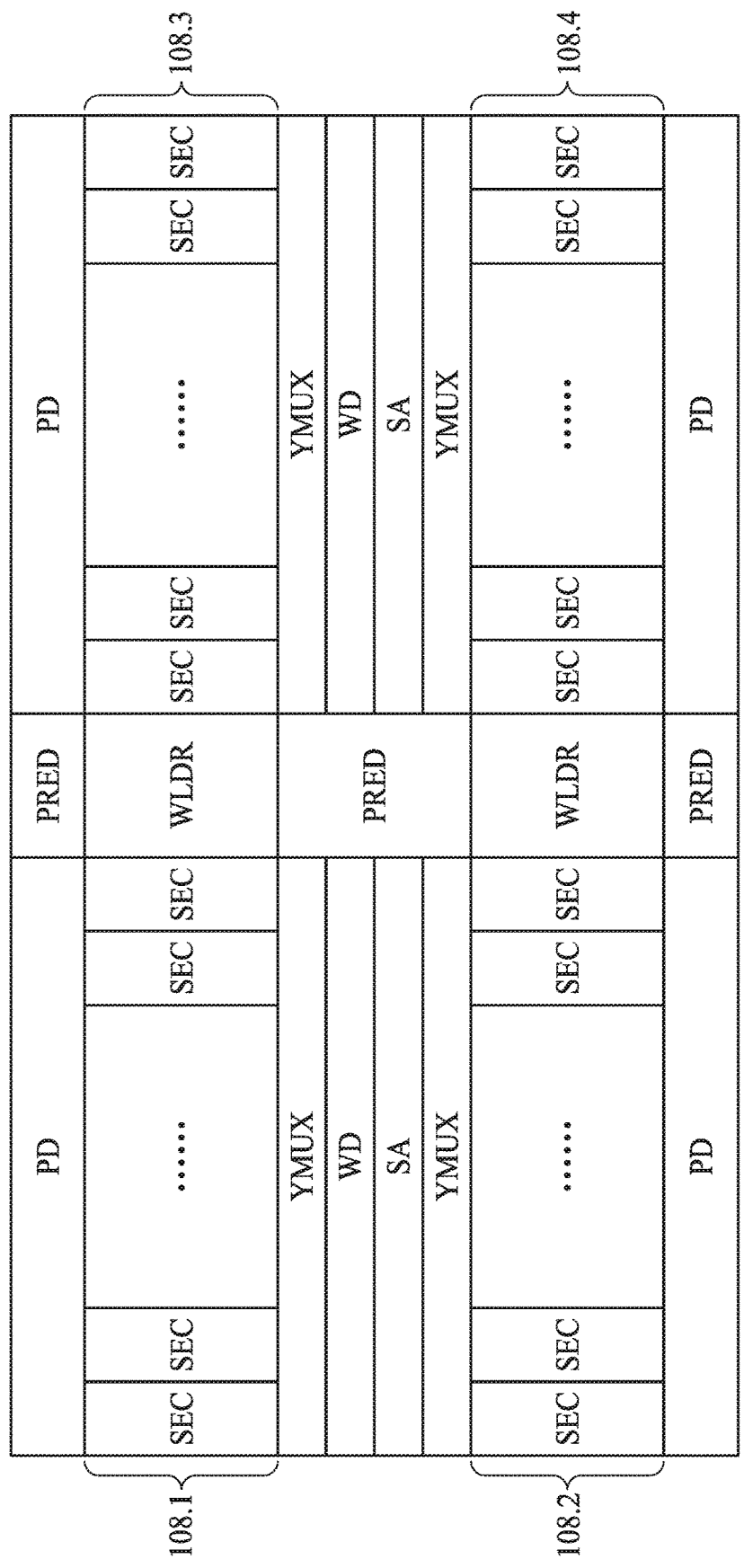
FIG. 1 illustrates a floor plan of an exemplary memory array layer of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a floor plan of an exemplary memory array layer of a memory device in accordance with some embodiments. The memory array layer 106 may include a plurality of memory cell arrays 108.1-108.4, which are also referred to as memory banks. Each memory cell array includes a plurality of memory sections, each labeled SEC, and each memory section includes a plurality of magnetic memory cells (not shown in FIG. 1) arranged in rows and columns. Regarding each memory cell array, magnetic memory cells in a same row are coupled to a same wordline (not shown in FIG. 1), and magnetic memory cells in a same column are coupled to a same bitline (not shown in FIG. 1). Please note that the memory array layer 106 shown in FIG. 1 can be implemented by a memory array layer of other types of memory devices, such as a capacitance-based memory device including capacitive memory cells or a resistance-based memory device including resistive memory cells. Such modifications are also fall within the scope of the present disclosure.

The memory array layer 106 may further include memory peripheral circuitry, which includes, but is not limited to, pre-decoder circuit blocks (PRED), wordline driver circuit blocks (WLDR), pull-down circuit blocks (PD), amplifier circuit blocks (SA), column selection logic or column multiplexer circuit blocks (YMUX), and write driver circuit blocks (WD). The pre-decoder circuit blocks, including row pre-decoders and column pre-decoders, are configured to decode row addresses and column addresses. The wordline driver circuit blocks, coupled to wordlines disposed on the memory array layer 106 (not shown in FIG. 1), are configured to activate the wordlines. One or more wordline driver circuit blocks can further include final decoder circuit(s), configured to provide final decoded signals used to drive wordlines.

The pull-down circuit blocks are configured to drive bitlines and source lines (not shown in FIG. 1) disposed on the memory array layer 106. The amplifier circuit blocks, coupled to the bitlines, are configured to sense and amplify signals on the bitlines. By way of example but not limitation, each amplifier circuit block may include one or more amplifier circuits such as sense amplifiers. During a read operation, a pull-down circuit block can drive a current to a magnetic memory cell through a bitline, and couple a source line which is coupled to the magnetic memory cell to a predetermined voltage such as a ground voltage. In a voltage sensing scheme, a corresponding sense amplifier can be configured to output read data by comparing a voltage, developed between the bitline and the source line, to a reference voltage. In a current sensing scheme, the corresponding sense amplifier can be configured to output read data by comparing the current, flowing through the magnetic memory cell, to a reference current.

Each column multiplexer circuit block is configured to couple one bitline in a memory section to a corresponding amplifier circuit block, allowing each memory section to output one data bit at a time and therefore increasing the array efficiency of the memory array layer 106, i.e. an increased number of memory cells per unit area. Similarly, data outputted from a write driver circuit block can be written into a corresponding memory section through a corresponding column multiplexer circuit block. One or more write driver circuit blocks can include write circuit(s) and write driver(s) configured to write data into memory cells.

Please note that, in order to obtain better array efficiency, an amplifier circuit block is coupled to a long bitline and hence shared by numerous magnetic memory cells. However, a long bitline length results in increased bitline parasitic resistance. Since a resistance difference between an anti-parallel state and a parallel state of an MTJ of a magnetic memory cell is small, any parasitic resistance in a current path passing through the magnetic memory cell will tend to degrade the sensing ability. As a result, such long bitline not only increases bitline parasitic resistance but also limits the array efficiency.

The present disclosure describes exemplary memory devices having a plurality of bitlines segmented into bitline segments, which are formed on different circuit layers disposed one above another and electrically connected through a plurality of conductive through via structures penetrating the circuit layers. As a result, the exemplary memory devices can allow more memory cells per bitline, which not only reduces bitline parasitic resistance but also translates into area saving, i.e. a higher number of memory cells per unit area. In some embodiments, the exemplary memory devices can include a capacitance-based memory device, a resistance-based memory device or other types of memory devices. In some embodiments, circuit blocks of memory peripheral circuitry can be partitioned into the circuit layers in different ways to further increase array efficiency. The present disclosure further describes exemplary methods for operating the memory devices. In some embodiments, different circuit layers of an exemplary memory device may include different types of circuit elements of memory peripheral circuitry, such as amplifier circuits, bias circuits and write driver circuits. As a result, data and signals may be transmitted through conductive through via structures penetrating the different circuit layers to complete read/write operation. Further description is provided below.

Figure 2A:
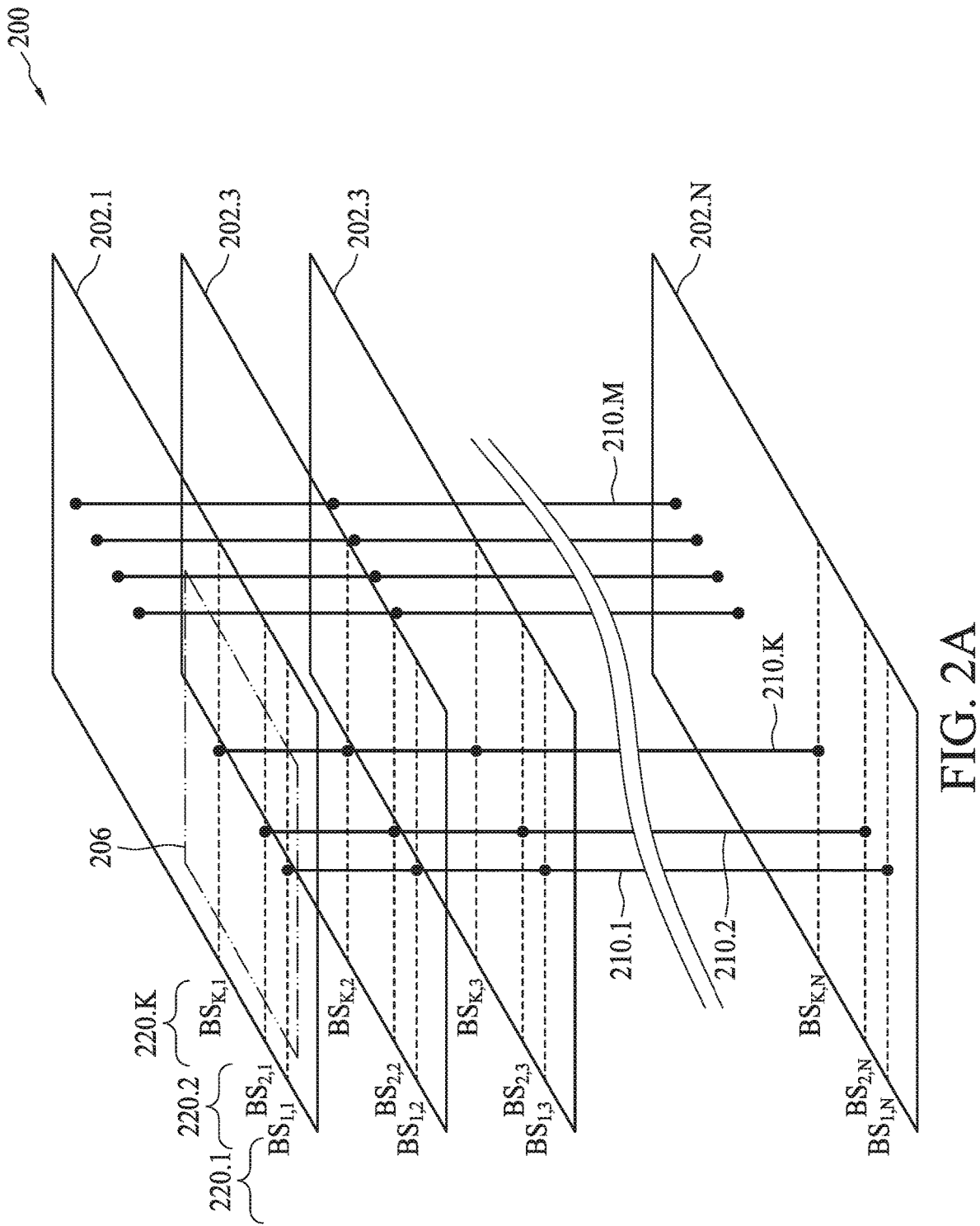
FIG. 2A is a diagram illustrating an exemplary memory device in accordance with some embodiments of the present disclosure.

FIG. 2A is a diagram illustrating an exemplary memory device in accordance with some embodiments of the present disclosure. The memory device 200 can be implemented by a capacitance-based memory device or a resistance-based memory device such as an MRAM device. The skilled in the art will recognize that the memory device 200 can be implemented by other types of memory devices without departing from the scope of the present disclosure. In the present embodiment, the memory device 200 can include a plurality of circuit layers 202.1-202.N, a plurality of first conductive through via structures 210.1-210.M, and a plurality of bitlines 220.1-220.K. Each of N, M and K is an integer greater than one. The circuit layers 202.1-202.N, such as integrated circuit (IC) layers or memory array layers, are disposed one above another, and each circuit layer may include one or more memory cell arrays. For the sake of simplicity, only one memory cell array 206 is illustrated in FIG. 2A.

The conductive through via structures 210.1-210.M may penetrate though the circuit layers 202.1-202.N to provide electrical connection between the circuit layers 202.1-202.N. At least one of the conductive through via structures 210.1-210.M may be a conductive through-substrate via structure such as a through-silicon via (TSV) structure. For example, the conductive through via structure 210.1 may include TSVs each extending between two adjacent circuit layers. However, those skilled in the relevant art will recognize the conductive through via structures 210.1-210.M can include other types of conductive through via structures without departing from the spirit and scope of the present disclosure.

Additionally, or alternatively, the memory device 200 may include a plurality of dielectric layers (not shown in FIG. 2A) interleaved with the circuit layers 202.1-202.N, and each dielectric layer may be disposed between two adjacent circuit layers. The conductive through via structures 210.1-210.M may penetrate though the circuit layers 202.1-202.N and the dielectric layers. For example, in some situations where the conductive through via structure 210.1 includes TSVs each extending between two adjacent circuit layers, each TSV penetrates through a corresponding dielectric layer.

Each of the bitlines 220.1-220.K may include a plurality of bitline segments disposed on the circuit layers 202.1-202.N respectively, and the bitline segments can be electrically connected through one of the conductive through via structures 210.1-210.M. Hence, a bitline can be segmented into N bitline segments using a conductive through via structure. For example, the bitline 220.1 may include a plurality of bitline segments $BS_{1,1}$-$BS_{1,N}$ disposed on the circuit layers 202.1-202.N respectively, the bitline 220.2 may include a plurality of bitline segments $BS_{2,1}$-$BS_{2,N}$ disposed on the circuit layers 202.1-202.N respectively, and the bitline 220.K may include a plurality of bitline segments $BS_{1,1}$-$BS_{K,N}$ disposed on the circuit layers 202.1-202.N respectively. The conductive through via structures 210.1, 210.2 and 210.K may be arranged to electrically connect the bitline segments $BS_{1,1}$-$BS_{1,N}$, $BS_{2,1}$-$BS_{2,N}$ and $BS_{K,1}$-$BS_{K,N}$, respectively.

In some situations, at least a portion of the conductive through via structures 210.1-210.M can be arranged to electrically connect other types of conductive/signal lines, such as wordlines or source lines, disposed on different circuit layers. In some situations, at least a portion of the conductive through via structures 210.1-210.M can be arranged to penetrate only a portion of the circuit layers 202.1-202.N. Those skilled in the art will recognize that such equivalent constructions do not depart from the spirit and scope of the present disclosure.

In the embodiment shown in FIG. 2A, each bitline segment of the bitlines 220.1-220.K may be coupled to a plurality of memory cells of a memory cell array of a circuit layer where the bitline segment is disposed, and the circuit layer further includes a plurality of wordlines associated with the bitline segment. With the aid of conductive through via structures, bitline segments respectively disposed on the circuit layers 202.1-202.N are electrically connected to form a bitline of a three-dimensional (3D) memory device such as a 3D MRAM device.

Figure 2B:
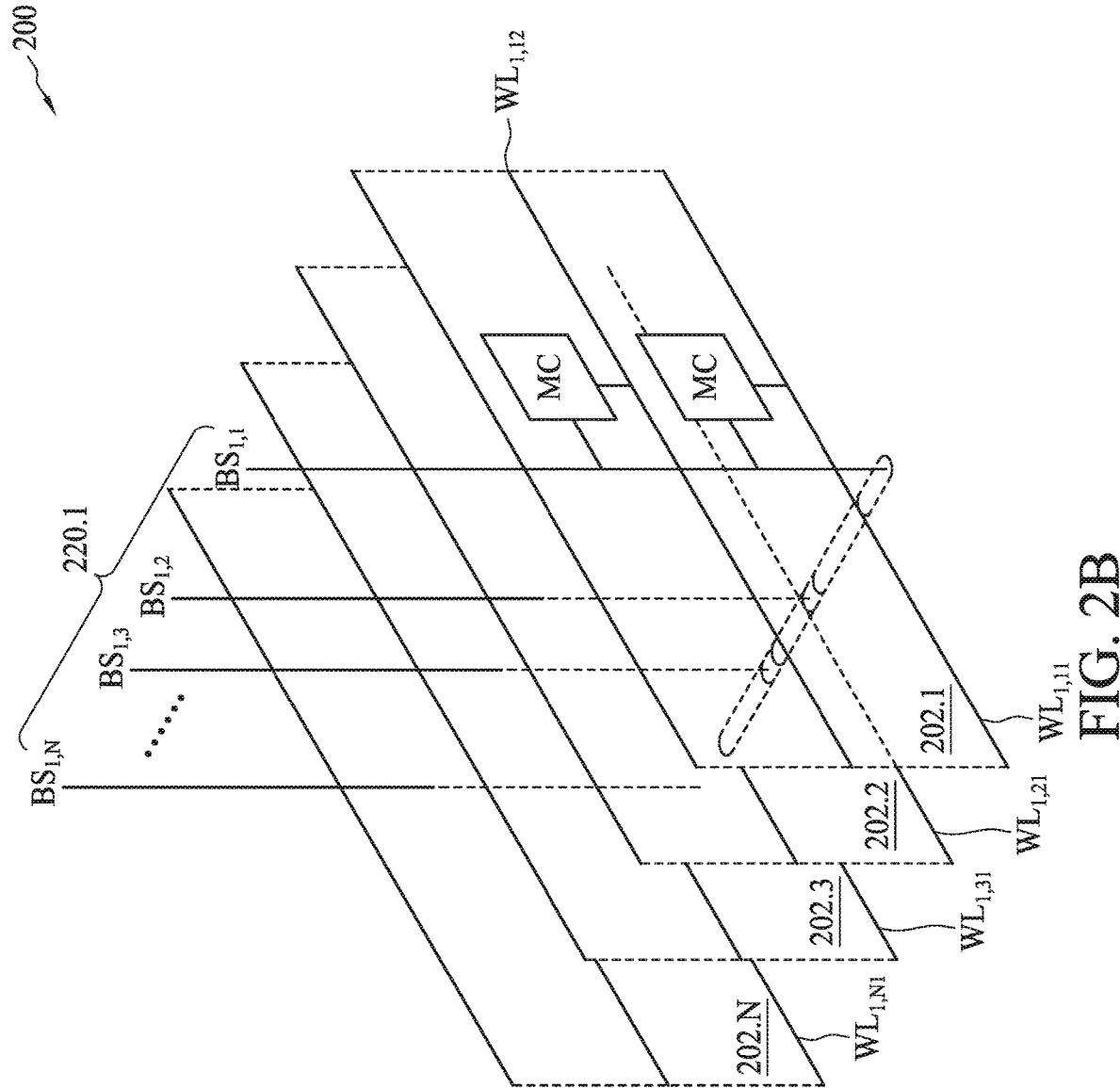
FIG. 2B is a 3D perspective view of a portion of the memory device shown in FIG. 2A in accordance with some embodiments of the present disclosure.

FIG. 2B is a 3D perspective view of a portion of the memory device 200 shown in FIG. 2A in accordance with some embodiments of the present disclosure. For illustrative purposes, only the bitline 220.1 and a portion of associated wordlines are shown. Those skilled in the art would understand that other bitlines shown in FIG. 2A and associated wordlines can be disposed in a manner similar/identical to that shown in FIG. 2B. In the present embodiment, wordlines $WL_{1,11}$ and $WL_{1,12}$ disposed on the circuit layer 202.1 are associated with the bitline segment $BS_{1,1}$ since each of the wordlines $WL_{1,11}$ and $WL_{1,12}$ is coupled to a memory cell MC which is coupled to the bitline segment $BS_{1,1}$. Each memory cell MC coupled to the bitline segment $BS_{1,1}$ can be accessed in response to activation of a corresponding wordline.

Similarly, a wordline $WL_{1,21}$ disposed on the circuit layer 202.2 are associated with the bitline segment $BS_{1,2}$, a wordline $WL_{1,31}$ disposed on the circuit layer 202.3 are associated with the bitline segment $BS_{1,3}$, and a wordline $WL_{1,N1}$ disposed on the circuit layer 202.N are associated with the bitline segment $BS_{1,N}$. Each memory cell coupled to a bitline segment can be accessed in response to activation of a corresponding wordline. As the bitline segments $BS_{1,1}$-$BS_{1,N}$ are electrically connected to form the bitline 220.1 with the aid of the conductive through via structures 210.1, each memory cell coupled to the bitline 220.1 can be accessed in response to activation of a corresponding wordline. Accordingly, the bitline 220.1 can serve as a bitline of a 3D memory device, i.e. the memory device 200.

By connecting memory cells, or memory cell arrays, in different circuit layers through conductive through via structures, the memory device 200 can segment a bitline into multiple bitline segments, allowing more memory cells per bitline which translates into area saving. As a result, the memory device 200 can have an increased number of memory cells per unit area. In addition, different circuit layers of the memory device 200 may include different circuit blocks of memory peripheral circuitry, thus further increasing the number of memory cells per unit area of a circuit layer. For example, different types of circuit blocks of memory peripheral circuitry, such as the pull-down circuit blocks, the amplifier circuit blocks and the write driver circuit blocks shown in FIG. 1, can be partitioned into different circuit layers of the memory device 200. Furthermore, as a bitline of the memory device 200 can be segmented into bitline segments connected in a parallel manner, a parasitic resistance between two distant memory cells coupled to the same bitline, e.g. two memory cells respectively connected to the bitline segment $BS_{1,1}$ and $BS_{1,N}$, can be greatly reduced. Compared with a two-dimensional (2D) memory device, which has only a single circuit layer and hence a limited number of cells per bitline, the memory device 200 can release the restrictions on the bitline length and build an efficient memory array in a 3D fashion by segmenting a 2D memory array layer along a bitline direction.

Figure 3:
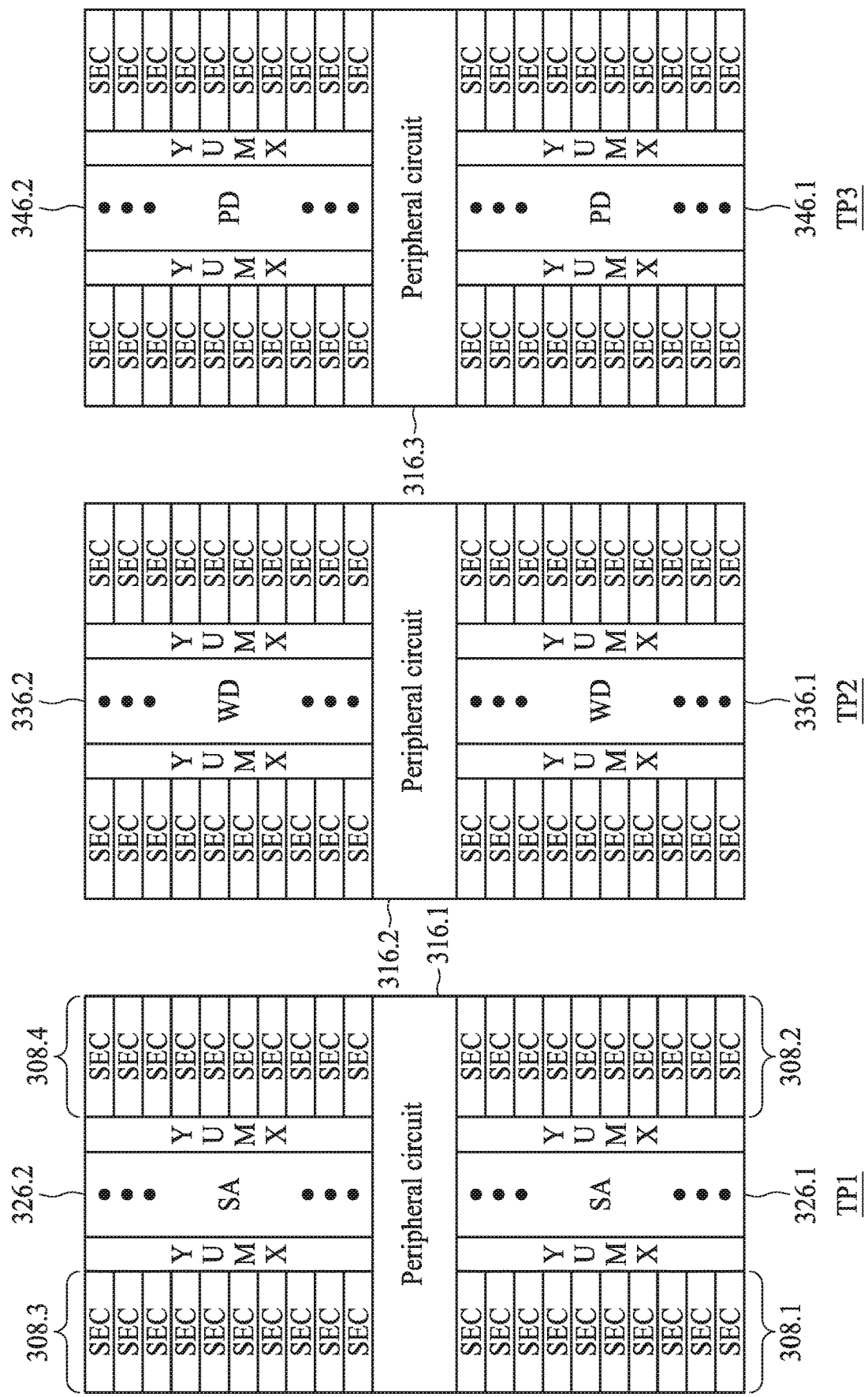
FIG. 3 illustrates circuit layers having different layouts in accordance with some embodiments of the present disclosure.

To facilitate understanding of the present disclosure, exemplary floor plans of circuit layers are given in the following for further description of a 3D memory device having segmented bitlines. Those skilled in the art should understand that other floor plans of circuit layers can be used to form a 3D memory device employing the structure shown in FIG. 1 without departing from the scope of the present disclosure. Referring firstly to FIG. 3, circuit layers having different layouts TP1-TP3 are illustrated in accordance with some embodiments of the present disclosure. Each of the circuit layers shown in FIG. 3 can represent an embodiment of at least one of the circuit layers 202.1-202.N shown in FIG. 2A. Also, each of the circuit layers shown in FIG. 3 can be implemented to include a portion of the memory array layer 106 shown in FIG. 1.

The circuit layer having the layout TP1 may include a plurality of memory cell arrays 308.1-308.4, a peripheral circuit block 316.1, column selection logic or a plurality of column multiplexer circuit blocks (YMUX), and a plurality of amplifier circuit blocks (SA) 326.1 and 326.2. Each of the memory cell arrays 308.11-308.14, also referred to a memory bank, includes a plurality of memory sections (SEC). Each memory section includes a plurality of memory cells (not shown in FIG. 3) arranged in rows and columns. Regarding each memory cell array, memory cells in a same row are coupled to a same wordline (not shown in FIG. 3), and memory cells in a same column are coupled to a same bitline segment (not shown in FIG. 3) or a same bitline. The peripheral circuit 316.1 can be implemented to include the pre-decoder circuits and the wordline driver circuits as illustrated in FIG. 1.

Each column multiplexer circuit block may include one or more column multiplexer circuits. Each column multiplexer circuit is configured to couple one of bitline segments in a memory section to a corresponding amplifier circuit within an amplifier circuit block, allowing each memory section to output one data bit at a time and therefore increasing the memory array efficiency. The amplifier circuit blocks 326.1 and 326.2 can be implemented to include the amplifier circuit blocks shown in FIG. 1. Each amplifier circuit block can include one or more amplifier circuits such as sense amplifiers. Filled dots in the amplifier circuit blocks 326.1 and 326.2 represent a portion of conductive through via structures penetrating the circuit layer having the layout TP1, wherein the conductive through via structures can be implemented by TSVs and serve as global input/output (I/O) lines.

In some embodiments, the circuit layer having the layout TP1 can employ an open bitline architecture, where a pair of bitlines includes two bitlines located on either side of a shared sense amplifier. The open bitline architecture can achieve a high-density memory cell array. For example, in the open bitline architecture, two bitlines coupled to a sense amplifier in the amplifier circuit block 326.1 are disposed in the memory cell arrays 308.1 and 308.2 respectively. In some other embodiments, the circuit layer having the layout TP1 can employ a folded bitline architecture, where a pair of bitlines sharing a same sense amplifier includes adjacent two bitlines. One of the two bitlines serves as a voltage reference when a memory cell connected to the other of the two bitlines is being accessed, thereby helping reduce common source noise applied to the two bitlines. For example, in the folded bitline architecture, two bitlines coupled to a sense amplifier in the amplifier circuit block 326.1 are disposed in two of the memory sections of the memory cell array 308.1, respectively.

The floor plan of the circuit layer having the layout TP2 is similar/identical to that of the circuit layer having the layout TP1 except that the circuit layer having the layout TP2 includes a plurality of write driver circuit blocks (WD) 336.1 and 336.2. The write driver circuit blocks 336.1 and 336.2 can be implemented to include the write driver circuit blocks shown in FIG. 1. Filled dots in the write driver circuit blocks 336.1 and 336.2 represent a portion of conductive through via structures penetrating the circuit layer having the layout TP2, wherein the conductive through via structures can be implemented by TSVs and serve as global I/O lines.

Each write driver circuit block can include one or more write driver circuits. Each write driver circuit can write data into a memory cell in a memory section through a corresponding column multiplexer circuit in a column multiplexer circuit block. In some embodiments, each write driver circuit can include a write circuit and a write driver configured to write data into memory cells. In addition, the peripheral circuit 316.2 can be implemented to include the pre-decoder circuits and the wordline driver circuits as illustrated in FIG. 1.

The floor plan of the circuit layer having the layout TP3 is similar or identical to that of the circuit layer having the layout TP1 except that the circuit layer having the layout TP3 includes a plurality of pull-down circuit blocks (PD) 346.1 and 346.2. The pull-sown circuit blocks 346.1 and 346.2 can be implemented to include the pull-down circuit blocks shown in FIG. 1. Filled dots in the pull-down circuit blocks 346.1 and 346.2 represent a portion of conductive through via structures penetrating the circuit layer having the layout TP3, wherein the conductive through via structures can be implemented by TSVs and serve as global I/O lines.

Figure 4:
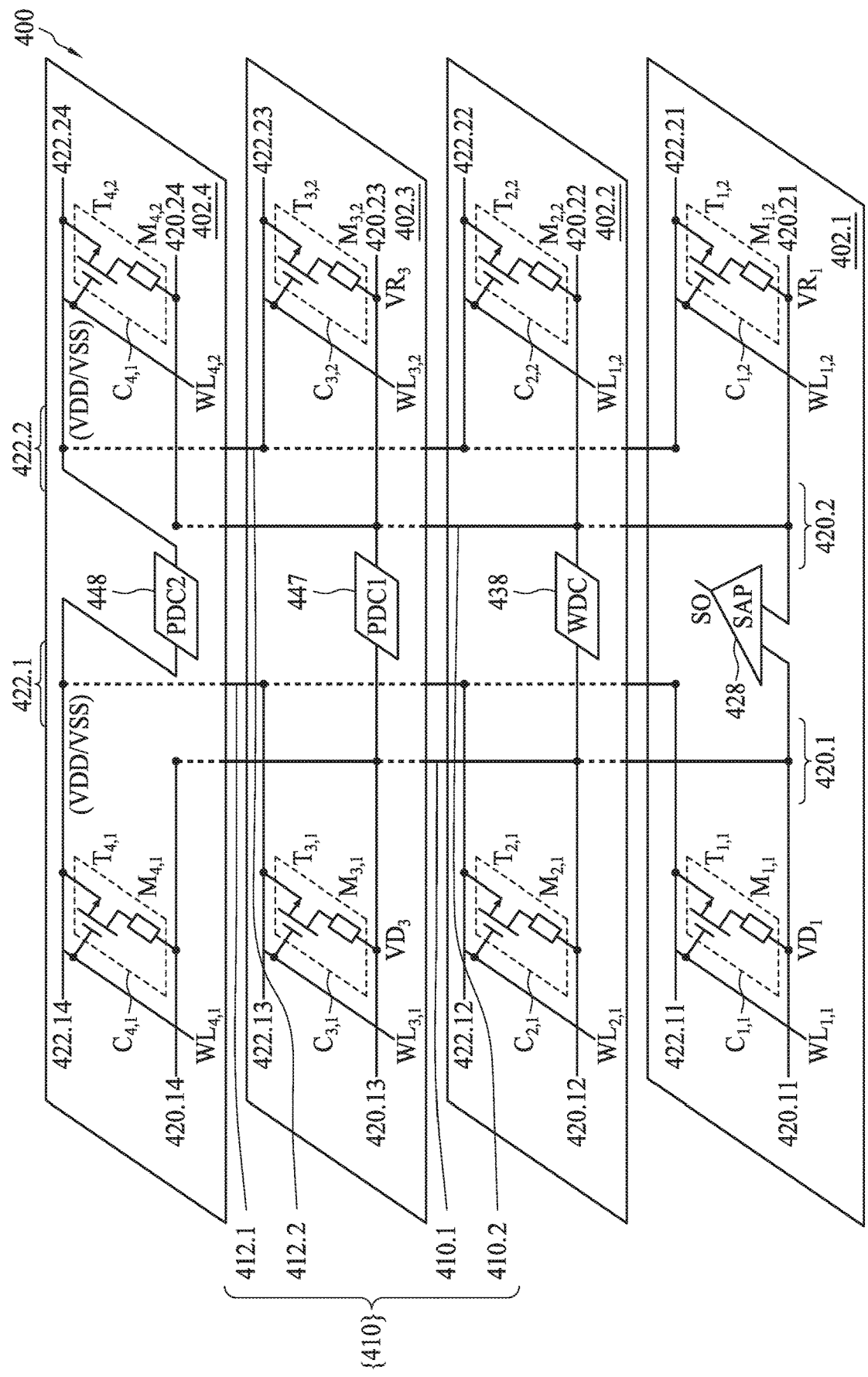
FIG. 4 illustrates a memory device having a plurality of circuit layers employing the different layouts shown in FIG. 3 in accordance with some embodiments of the present disclosure.

The circuit layers shown in FIG. 3 may be stacked on top of each other, or disposed one above another, to form a 3D memory device or a 3D memory array. Referring to FIG. 4, a memory device 400 having a plurality of circuit layers employing the different layouts TP1-TP3 shown in FIG. 3 is illustrated in accordance with some embodiments of the present disclosure. The memory device 400 can represent an embodiment of the memory device 200 shown in FIG. 2A. In the present embodiment, the memory device 400 can include four circuit layers 402.1-402.4, which are electrically connected through a plurality of conductive through via structures {410}. The circuit layer 402.1 can employ the layout TP1 shown in FIG. 3. The circuit layer 402.2 can employ the layout TP2 shown in FIG. 3. Each of the circuit layers 402.3 and 402.4 can employ the layout TP3 shown in FIG. 3. As a result, amplifier circuit blocks of the memory device 400 are disposed on the circuit layer 402.1, write driver circuit blocks of the memory device 400 are disposed on the circuit layer 402.2, and pull-down circuit blocks of the memory device 400 are disposed on the circuit layers 402.3 and 402.4. Please note that the number of circuit layers shown in FIG. 4 is for illustrative purposes. A memory device having a different number of circuit layers also falls within the scope of the present disclosure. For example, a memory device employing at least one of the layouts TP1-TP3 shown in FIG. 3 may have a different number of circuit layers. Also, at least one of the layouts TP1-TP3 shown in FIG. 3 can be implemented by a circuit configuration different from that shown in FIG. 4 without departing from the scope of the present disclosure. For example, at least one of the circuit layers 402.1-402.4 can employ a circuit configuration different from that shown in FIG. 4. Such modifications are also fall within the scope of the present disclosure.

The memory device 400 can be implemented as an MRAM device, which includes a plurality of magnetic memory cells each implemented using one transistor and one MTJ, i.e. a 1T-1MTJ bit-cell. A signal line coupled to a magnetic memory cell can be segmented into signal line segments disposed on different circuit layers. When the signal line is selected, the signal line segments are selected and electrically connected to each other. It should be noted that each magnetic cell can be implemented using one or more transistors and one or more MTJs, such as 2T-1MTJ, 1T-2MTJ, 2T-2MTJ or other bit-cell designs, without departing from the scope of the present disclosure. Also, the memory device 400 can be implemented as other types of memory devices without departing from the scope of the present disclosure.

For example, a bitline coupled to a magnetic memory cell can be segmented into bitline segments, which are respectively disposed on the circuit layers 402.1-402.4 and electrically connected through a corresponding conductive through via structure. A source line coupled to a magnetic memory cell can be segmented into source line segments, which are respectively disposed on the circuit layers 402.1-402.4 and electrically connected through a corresponding conductive through via structure.

In the present embodiment, the bitline 420.1 can be segmented into bitline segments 420.11-420.14. The bitline segments 420.11-420.14 are disposed on the circuit layers 402.1-402.4 respectively, and electrically connected through a conductive through via structure 410.1. The source line 422.1 can be segmented into source line segments 422.11-422.14. The source line segments 422.11-422.14 are disposed on the circuit layers 402.1-402.4 respectively, and electrically connected through a conductive through via structure 412.1. The memory cell $C_{1,1}$, including an MTJ $M_{1,1}$ and an access transistor $T_{1,1}$ disposed on the circuit layer 402.1, is coupled to a wordline $WL_{1,1}$, the bitline segment 420.11 and the source line segment 422.11. The memory cell $C_{2,1}$, including an MTJ $M_{2,1}$ and an access transistor $T_{2,1}$ disposed on the circuit layer 402.2, is coupled to a wordline $WL_{2,1}$, the bitline segment 420.12 and the source line segment 422.12. The memory cell $C_{3,1}$, including an MTJ $M_{3,1}$ and an access transistor $T_{3,1}$ disposed on the circuit layer 402.3, is coupled to a wordline $WL_{3,1}$, the bitline segment 420.13 and the source line segment 422.13. The memory cell $C_{4,1}$, including an MTJ $M_{4,1}$ and an access transistor $T_{4,1}$ disposed on the circuit layer 402.4, is coupled to a wordline $WL_{4,1}$, the bitline segment 420.14 and the source line segment 422.14.

Similarly, the bitline 420.2 can be segmented into bitline segments 420.21-420.24. The bitline segments 420.21-420.24 are disposed on the circuit layers 402.1-402.4 respectively, and electrically connected through a conductive through via structure 410.2. The source line 422.2 can be segmented into source line segments 422.21-422.24. The source line segments 422.21-422.24 are disposed on the circuit layers 402.1-402.4 respectively, and electrically connected through a conductive through via structure 412.2. The memory cell $C_{1,2}$, including an MTJ $M_{1,2}$ and an access transistor $T_{1,2}$ disposed on the circuit layer 402.1, is coupled to a wordline $WL_{1,2}$, the bitline segment 420.21 and the source line segment 422.21. The memory cell $C_{2,2}$, including an MTJ $M_{2,2}$ and an access transistor $T_{2,2}$ disposed on the circuit layer 402.2, is coupled to a wordline $WL_{2,2}$, the bitline segment 420.22 and the source line segment 422.22. The memory cell $C_{3,1}$, including an MTJ $M_{3,1}$ and an access transistor $T_{3,1}$ disposed on the circuit layer 402.3, is coupled to a wordline $WL_{3,2}$, the bitline segment 420.23 and the source line segment 422.23. The memory cell $C_{4,1}$, including an MTJ $M_{4,1}$ and an access transistor $T_{4,1}$ disposed on the circuit layer 402.4, is coupled to a wordline $WL_{4,1}$, the bitline segment 420.24 and the source line segment 422.24.

For illustrative purposes, only the bitlines 420.1 and 420.2, the source lines 422.1 and 422.2, and the conductive through via structures 410.1, 410.2, 412.1 and 412.2 of the memory device 400 are shown, but other bitlines, source lines and related can conductive through via structures be similarly created.

Circuit elements associated with the bitlines 420.1 and 420.2 and the source lines 422.1 and 422.2 are described below. Please note that a portion of the circuit elements associated with the bitlines 420.1 and 420.2 and the source lines 422.1 and 422.2 are not shown in FIG. 4 for the sake of simplicity. For example, column multiplexer circuits disposed on the circuit layers 402.1-402.4, which can be embodiments of a portion of the column multiplexer circuit blocks associated with the layouts TP1-TP3 shown in FIG. 3, are not shown in FIG. 4 for the sake of simplicity, but will be described in detail later. In addition, those skilled in the art will recognize that the description which follows can apply to circuit elements associated with other bitlines and source lines disposed on the circuit layers 402.1-402.4.

In the present embodiment, the circuit layer 402.1 can include a sense amplifier (labeled SAP) 428, which can represent an embodiment of a portion of an amplifier circuit block shown in FIG. 3. When the bitline 420.1 is selected during a read operation, the bitline segment 420.11 can be electrically connected to the conductive through via structure 410.1 and the sense amplifier 428 through a column multiplexer circuit (not shown in FIG. 4). When the bitline 420.2 is selected during a read operation, the bitline segment 420.12 can be electrically connected to the conductive through via structure 410.2 and the sense amplifier 428 through a column multiplexer circuit (not shown in FIG. 4).

It is worth noting that, when the bitline 420.1 is selected, the bitline segments 420.12-420.14, disposed the circuit layers 402.2-402.4 respectively, can also be coupled to the conductive through via structure 410.1. As the conductive through via structure 410.1 can provide electrical connection between the bitline segments 420.11-420.14 of the bitline 420.1, an input terminal $T_1$ of the sense amplifier 428 is shared by the bitline segments 420.11-420.14 during a read operation. Similarly, when the bitline 420.2 is selected, the bitline segments 420.22-420.24, disposed the circuit layers 402.2-402.4 respectively, can also be coupled to the conductive through via structure 410.2. As a result, an input terminal $T_2$ of the sense amplifier 428 is shared by the bitline segments 420.21-420.24 during a read operation.

In the present embodiment, the memory device 400 may employ an open bitline architecture to increase the array density. The bitline segment 420.11 of the bitline 420.1 and the bitline segment 420.21 of the bitline 420.2 may be located on either side of the shared sense amplifier 428. As a result, the memory cells $C_{1,1}$ and $C_{1,2}$, coupled to the bitline segments 420.11 and 420.21 respectively, may be disposed in different memory cell arrays, such as the memory cell arrays 308.1 and 308.2 shown in FIG. 3. Furthermore, to increase accuracy of distinguishing a difference between respective resistances in an anti-parallel state and a parallel state of an MTJ in read operations, the memory device 400 may concurrently process a data signal of a data memory cell and a related reference signal of a reference memory cell. By way of example but not limitation, when a memory cell coupled to the bitline 420.1 is to be read, the bitline 420.1 can serve as a data bitline including data bitline segments, and the bitline 420.2 can serve as a reference bitline each including reference bitline segments. Each magnetic memory cell coupled to the data bitline is used as a data memory cell, and each magnetic memory cell coupled to a reference bitline is used as a reference memory cell. As a result, the memory cells $C_{1,1}$, $C_{2,1}$, $C_{3,1}$ and $C_{4,1}$, coupled to the bitline 420.1, may serve as data memory cells. The memory cells $C_{1,2}$, $C_{2,2}$, $C_{3,2}$ and $C_{4,2}$, coupled to the bitline 420.2, may serve as reference memory cells.

It should be noted that a bitline serving as a data bitline can be a reference bitline in a different operating scenario, and that a bitline serving as a reference bitline can be a data bitline in a different operating scenario. For example, when a memory cell coupled to the bitline 420.2 is to be read, the bitline 420.2 can serve as a data bitline and the bitline 420.1 can serve as a reference bitline. As a result, the memory cells $C_{1,2}$, $C_{2,2}$, $C_{3,2}$ and $C_{4,2}$ are used as data memory cells, and the memory cells $C_{1,1}$, $C_{2,1}$, $C_{3,1}$ and $C_{4,1}$ are used as reference memory cells.

Regarding the circuit layer 402.2, a write driver circuit (labeled WDC) 438 included therein can represent an embodiment of a portion of a write driver circuit block shown in FIG. 3. When the bitline 420.1 is selected during a write operation, each of the bitline segments 420.11-420.14 of the bitline 420.1 can be electrically connected to the write driver circuit 438 through a column multiplexer circuit (not shown in FIG. 4). When the bitline 420.2 is selected during a write operation, each of the bitline segments 420.21-420.24 of the bitline 420.2 can be electrically connected to the write driver circuit 438 through a column multiplexer circuit (not shown in FIG. 4).

The circuit layer 402.3 can include a pull-down circuit (labeled PDC1) 447, which can represent an embodiment of a portion of a pull-down circuit block shown in FIG. 3. In the present embodiment, the pull-down circuit 447 can include one or more bias circuits (not shown in FIG. 4), such as current sources, to send a bias signal to one or more memory cells. The bias signal can be a voltage signal or a current signal. When the bitline 420.1 is selected, each of the bitline segments 420.11-420.14 of the bitline 420.1 can be electrically connected to the pull-down circuit 447 through a column multiplexer circuit (not shown in FIG. 4). When the bitline 420.2 is selected, each of the bitline segments 420.21-420.24 of the bitline 420.2 can be electrically connected to the pull-down circuit 447 through a column multiplexer circuit (not shown in FIG. 4).

The circuit layer 402.4 can include a pull-down circuit (labeled PDC2) 448, which can represent an embodiment of a portion of a pull-down circuit block shown in FIG. 3. In the present embodiment, the pull-down circuit 448 can include pull-down transistors (not shown in FIG. 4) each configured to couple a corresponding source segment to a predetermined voltage VDD or a predetermined voltage VSS. When the source line 422.1 is selected, the conductive through via structure 412.1 can provide electrical connection between the source line segments 422.11-422.14 of the source line 422.1, and each of the source line segments 422.11-422.14 can be electrically connected to the pull-down circuit 448 through a column multiplexer circuit (not shown in FIG. 4). When the source line 422.2 is selected, the conductive through via structure 412.2 can provide electrical connection between the source line segments 422.21-422.24 of the source line 422.2, and each of the source line segments 422.21-422.24 can be electrically connected to the pull-down circuit 448 through a column multiplexer circuit (not shown in FIG. 4). As a result, the pull-down circuit 448 disposed on the circuit layer 402.4 can be shared with the circuit layers 402.1-402.3.

As the amplifier circuit blocks, the write driver circuit blocks and the pull-down circuit blocks of the memory device 400 are disposed on the different circuit layers 402.1-402.4, data and signals may be transmitted through the conductive through via structures {410} to complete read/write operation.

In some embodiments, during a read operation where data stored in the memory cell $C_{1,1}$ on the circuit layer 402.1 is to be read, the bitline segments 420.11 and 420.21, serving as a data bitline and a reference bitline respectively, are selected. The source line segments 422.11 and 422.21, coupled to the memory cells $C_{1,1}$ and $C_{1,2}$, are also selected. In addition, the wordline $WL_{1,1}$ is activated to turn on the access transistor $T_{1,1}$, and the wordline $WL_{1,2}$ is activated to turn on the access transistor $T_{1,2}$ of the magnetic memory cell $C_{1,2}$. The pull-down circuit 447 on the circuit layer 402.3 is configured to send a bias signal to the MTJ $M_{1,1}$ of the magnetic memory cell $C_{1,1}$ through the conductive through via structure 410.1, and is configured to drive a bias signal to the MTJ $M_{1,2}$ of the magnetic memory cell $C_{1,2}$ through the conductive through via structure 410.2. The pull-down circuit 448 on the circuit layer 402.4 is configured to couple the source line segments 422.11 and 422.12 to the predetermined voltage VSS, such as a ground voltage, through the conductive through via structures 412.1 and 412.2 respectively. As a result, the sense amplifier 428 on the circuit layer 402.1 may generate an output signal SO according to a voltage signal $VD_1$ and a voltage signal $VR_1$, developed at the memory cells $C_{1,1}$ and $C_{1,2}$ respectively, thereby determining a resistance state of the MTJ $M_{1,1}$. The voltage signal $VD_1$ serves as a data signal generated in response to the bias signal sent to the memory cell $C_{1,1}$, and the voltage signal $VR_1$ serves as a reference signal generated in response to the bias signal sent to the memory cell $C_{1,2}$.

It is worth noting that the pull-down circuit 447 is electrically connected to the magnetic memory cell $C_{1,1}$ through the conductive through via structure 410.1 rather than a long bitline. Compared to a 2D MRAM device, which has a large parasitic wiring resistance in a current path for a far-end memory cell because of a long bitline, a parasitic wiring resistance in a current path from the pull-down circuit 447 to the memory cell $C_{1,1}$ is relatively small. Similarly, a parasitic wiring resistance in a current path from the bias circuit of the pull-down circuit 447 to the memory cell $C_{1,2}$ is small. As a result, a difference between respective resistances in an anti-parallel state and a parallel state of the MTJ $M_{1,1}$ can be accurately distinguished.

In some other embodiments, during a read operation where data stored in the memory cell $C_{3,1}$ on the circuit layer 402.3 is to be read, the bitline segments 420.31 and 420.32, serving as a data bitline and a reference bitline respectively, are selected. The source line segments 422.31 and 422.32, coupled to the memory cells $C_{3,1}$ and $C_{3,2}$, are also selected. The wordline $WL_{3,1}$ is activated to turn on the access transistor $T_{3,1}$, and the wordline $WL_{3,2}$ is activated to turn on the access transistor $T_{3,2}$ of the memory cell $C_{3,2}$. In addition, the pull-down circuit 447 is configured to drive a current to the MTJ $M_{3,1}$ of the magnetic memory cell $C_{3,1}$, and is configured to drive a current to the MTJ $M_{3,2}$ of the magnetic memory cell $C_{3,2}$. The pull-down circuit 448 on the circuit layer 402.4 is configured to couple the source line segments 422.31 and 422.32 to the predetermined voltage VSS through the conductive through via structures 412.1 and 412.2, respectively. As a result, the sense amplifier 428 on the circuit layer 402.1 may generate the output signal SO according to a voltage signal $VD_3$ and a voltage signal $VR_3$, developed at the memory cells $C_{3,1}$ and $C_{3,2}$ respectively, thereby determining a resistance state of the MTJ $M_{3,1}$.

Similarly, a parasitic wiring resistance in a current path from the magnetic memory cell $C_{3,1}/C_{3,2}$ to the sense amplifier 428 is relatively small since the sense amplifier 428 is electrically connected to the magnetic memory cell $C_{3,1}/C_{3,2}$ through the conductive through via structure 410.1/410.2 rather than a long bitline. A difference between respective resistances in an anti-parallel state and a parallel state of the MTJ $M_{3,1}$ can be accurately distinguished. As a result, the memory device 400 employing a segmented bitline structure can have a large number of memory cells per bitline while maintaining data accuracy.

In some embodiments, the memory device 400 may operate in a write mode where the write driver circuit 438 on the circuit layer 402.2 is configured to write data into memory cells. By way of example but not limitation, during a write operation where a low resistance state, i.e. "0", is to be written into the memory cell $C_{4,1}$ on the circuit layer 402.4, the bitline 420.1 is selected such that the bitline segment 420.41 is coupled to the write driver circuit 438 through the conductive through via structure 410.1. In addition, the wordline $WL_{4,1}$ is activated to turn on the access transistor $T_{4,1}$. With the use of the conductive through via structure 410.1, the write driver circuit 438 on the circuit layer 402.2 can drive a data signal to the bitline segment 420.41, thereby steering a current which flows from a fixed layer to a free layer of the MTJ $M_{4,1}$ on the circuit layer 302.4. The bitline segment 420.41, or the bitline 420.1, can be charged to the predetermined voltage VDD such as a supply voltage. Additionally, the pull-down circuit 448 is configured to couple the source line segment 422.41, or the source line 422.1, to the predetermined voltage VSS such as a ground voltage. As a result, the MTJ $M_{4,1}$ can be programmed into parallel configuration.

As another example, during a write operation where a high resistance state, i.e. "1", is to be written into the magnetic memory cell $C_{4,1}$ on the circuit layer 402.4, the bitline 420.1 is selected, and the wordline $WL_{4,1}$ is activated to turn on the access transistor $T_{4,1}$. The write driver circuit 438 is configured to drive a data signal to the bitline segment 420.41, thereby steering a current which flows from the free layer to the fixed layer of the MTJ $M_{4,1}$. The bitline 420.1 can be discharged to the predetermined voltage VSS. Additionally, the pull-down circuit 448 is configured to couple the source lines 422.1 to the predetermined voltage VDD. As a result, the MTJ $M_{4,1}$ can be programmed into anti-parallel configuration.

Please note that the circuit layers 402.1-402.4 shown in FIG. 4 can be stacked in different manners to form a 3D memory device without departing from the spirit and scope of the present disclosure.

Figure 5:
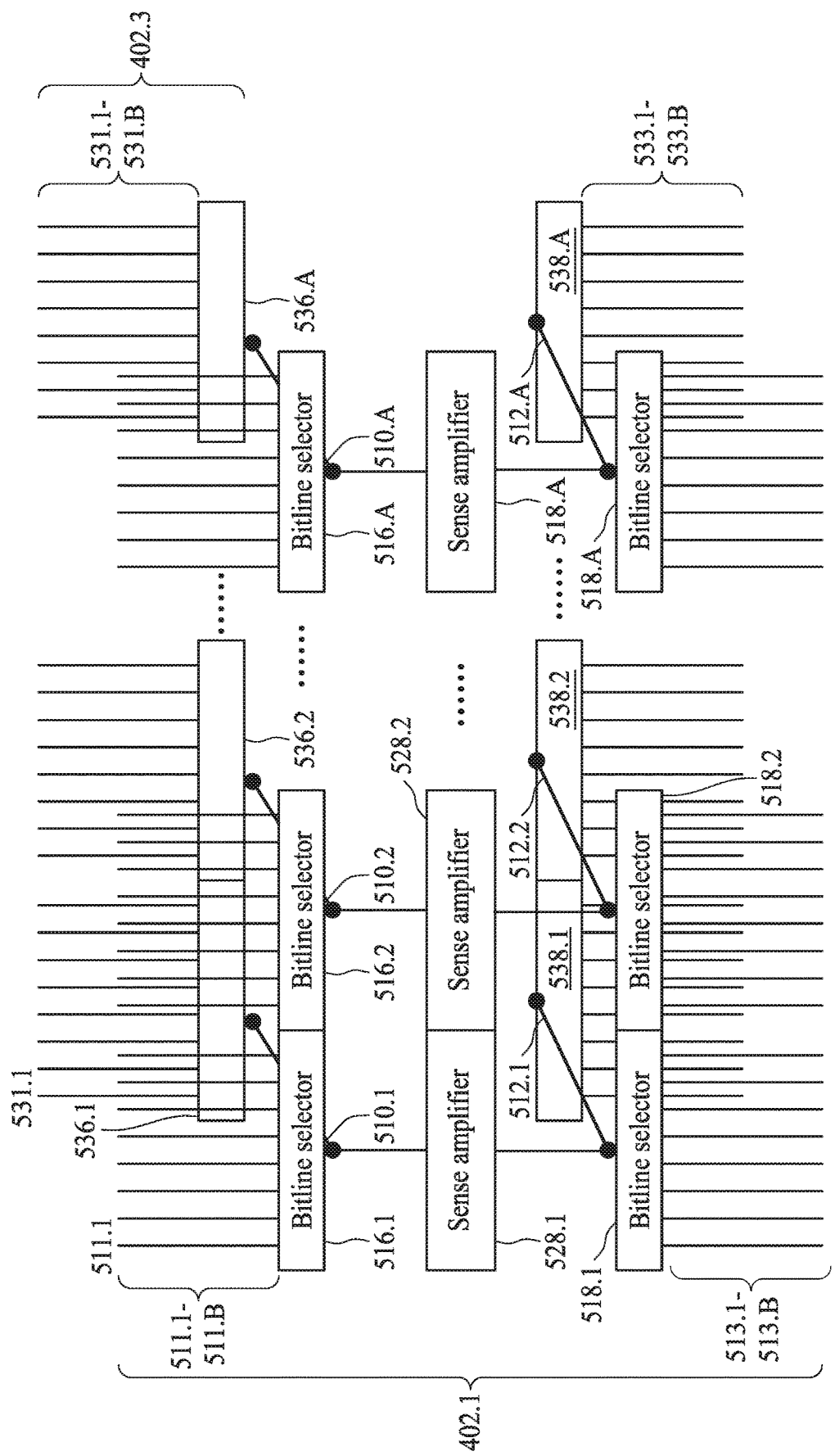
FIG. 5 illustrates exemplary bitline segment connection between different circuit layers shown in FIG. 4 in accordance with some embodiments of the present disclosure.

FIG. 5 illustrates exemplary bitline segment connection between different circuit layers shown in FIG. 4 in accordance with some embodiments of the present disclosure. For illustrative purposes, the circuit layers 402.2 and 402.4 are not shown here. The skilled in the art will recognize that the description that follows can be used to electrically connect segmented bitlines disposed on any two of the circuit layers 402.1-402.4 shown in FIG. 4. Also, the description that follows can be used to electrically connect segmented bitlines disposed on any two of the circuit layers 202.1-202.N as described above in FIG. 2A.

In the present embodiment, the circuit layer 402.1 can include a plurality of sense amplifiers 528.1-528.A, a plurality of bitline selectors 516.1-516.A, and a plurality of bitline selectors 518.1-518.A, where A is a positive integer greater than one. One of the sense amplifiers 528.1-528.A can represent an embodiment of the sense amplifier 428 shown in FIG. 4. One of the bitline selectors 516.1-516.A can represent an embodiment of a column multiplexer circuit coupled to the input terminal $T_1$ of the sense amplifier 428 shown in FIG. 4. One of the bitline selectors 518.1-518.A can represent an embodiment of a column multiplexer circuit coupled to the input terminal $T_2$ of the sense amplifier 428 shown in FIG. 4. One of bitline segments 511.1-511.B (B is a positive integer greater than one) can represent an embodiment of the bitline segment 420.11 shown in FIG. 4. One of bitline segments 513.1-513.B can represent an embodiment of the bitline segment 420.12 shown in FIG. 4.

The circuit layer 402.3 can include a plurality of bitline selectors 536.1-536.A and a plurality of bitline selectors 538.1-538.A. One of the bitline selectors 536.1-536.A can represent an embodiment of a column multiplexer circuit coupled to the conductive through via structure 410.1 shown in FIG. 4. One of the bitline selectors 538.1-538.A can represent an embodiment of a column multiplexer circuit coupled to the conductive through via structure 410.2 shown in FIG. 4. One of bitline segments 531.1-531.B can represent an embodiment of the bitline segment 420.21 shown in FIG. 4. One of bitline segments 533.1-533.B can represent an embodiment of the bitline segment 420.21 shown in FIG. 4.

The circuit layer 402.3 is electrically connected to the circuit layer 402.1 through conductive through via structures 510.1-510.A and 512.1-512.A. One of the conductive through via structures 510.1-510.A can represent an embodiment of the conductive through via structure 410.1 shown in FIG. 4. One of the conductive through via structures 512.1-512.A can represent an embodiment of the conductive through via structure 410.2 shown in FIG. 4.

In the present embodiment, a bitline segment disposed on the circuit layer 402.1 is electrically connected to a bitline segment disposed on the circuit layer 402.3 after column multiplexing. One of the bitline selectors 516.1-516.A is configured to couple one of bitline segments disposed on the circuit layer 402.1 to a corresponding conductive through via structure, and one of the bitline selectors 536.1-536.A is configured to couple one of bitline segments disposed on the circuit layer 402.3 to the same conductive through via structure. For example, the bitline segment 511.1 and the bitline segment 531.1 can be segmented from a same bitline. When the bitline is selected, the bitline selector 516.1 can be configured to couple the bitline segment 511.1 to the conductive through via structure 510.1, and the bitline selector 536.1 can be configured to couple the bitline segment 531.1 to the conductive through via structure 510.1 such that the bitline segment 511.1 and the bitline segment 531.1 are electrically connected. The bitline segments 513.1-513.B on the circuit layer 402.1 can be electrically connected to the bitline segments 533.1-533.B on the circuit layer 402.3 in a similar/identical manner.

As different bitline segments coupled to a same bitline selector can share a same conductive through via structure, the number of conductive through via structures can be reduced. By way of example but not limitation, in some embodiments where each of the bitline selectors 516.1-516.A is configured to couple one of eight bitline segments to a corresponding sense amplifier, the number of sense amplifiers coupled to the bitline selectors 516.1-516.A, as well as the number of conductive through via structures coupled to the bitline selectors 516.1-516.A, would be equal to one-eighth of the number of bitline segments coupled to the bitline selectors 516.1-516.A, i.e. A=B/8.

In addition, as a sense amplifier of the circuit layer 402.1 can be electrically connected to a bitline selector of the circuit layer 402.3 through a conductive through via structure, the sense amplifier on the circuit layer 402.1 can receive data outputted from a memory cell of the circuit layer 402.3. For example, the sense amplifier 528.1 of the circuit layer 402.1 can be electrically connected to the bitline selector 536.1 of the circuit layer 402.3 through the conductive through via structure 510.1 such that the sense amplifier 528.1 may receive data outputted from the circuit layer 402.3.

In some embodiments, the bitline segment connection between two circuit layers shown in FIG. 5 can be used to electrically connect one circuit layer including write driver circuits, such as the circuit layer 402.2 shown in FIG. 4, to another circuit layer. For example, a bitline segment 420.21/420.22 disposed on the circuit layer 402.2 shown in FIG. 4 can be electrically connected to a bitline segment disposed on a different circuit layer shown in FIG. 4 after column multiplexing. In these embodiments, the bitline segment connection between the circuit layer 402.2 and the different circuit layer is similar/identical to that shown in FIG. 5 except that the sense amplifiers shown in FIG. 5 are replaced with the write driver circuits.

In some embodiments, the bitline segment connection between two circuit layers shown in FIG. 5 can be used to electrically connect one circuit layer including pull-down circuits, such as the circuit layer 402.3/403.4 shown in FIG. 4, to another circuit layer. For example, a bitline segment 420.31/420.32 disposed on the circuit layer 402.3 shown in FIG. 4 can be electrically connected to a bitline segment disposed on a different circuit layer shown in FIG. 4 after column multiplexing. In these embodiments, the bitline segment connection between the circuit layer 402.3 and the different circuit layer is similar/identical to that shown in FIG. 5 except that the sense amplifiers shown in FIG. 5 are replaced with the pull-down circuits.

It should be noted that the bitline segment connection between two circuit layers shown in FIG. 5 can be used to electrically connect other types of segmented signal lines, such as segmented source lines, disposed on any two of the circuit layers 402.1-402.4 shown in FIG. 4, or the circuit layers 202.1-202.N as described above in FIG. 2A, without departing from the scope of the present disclosure.

Figure 6:
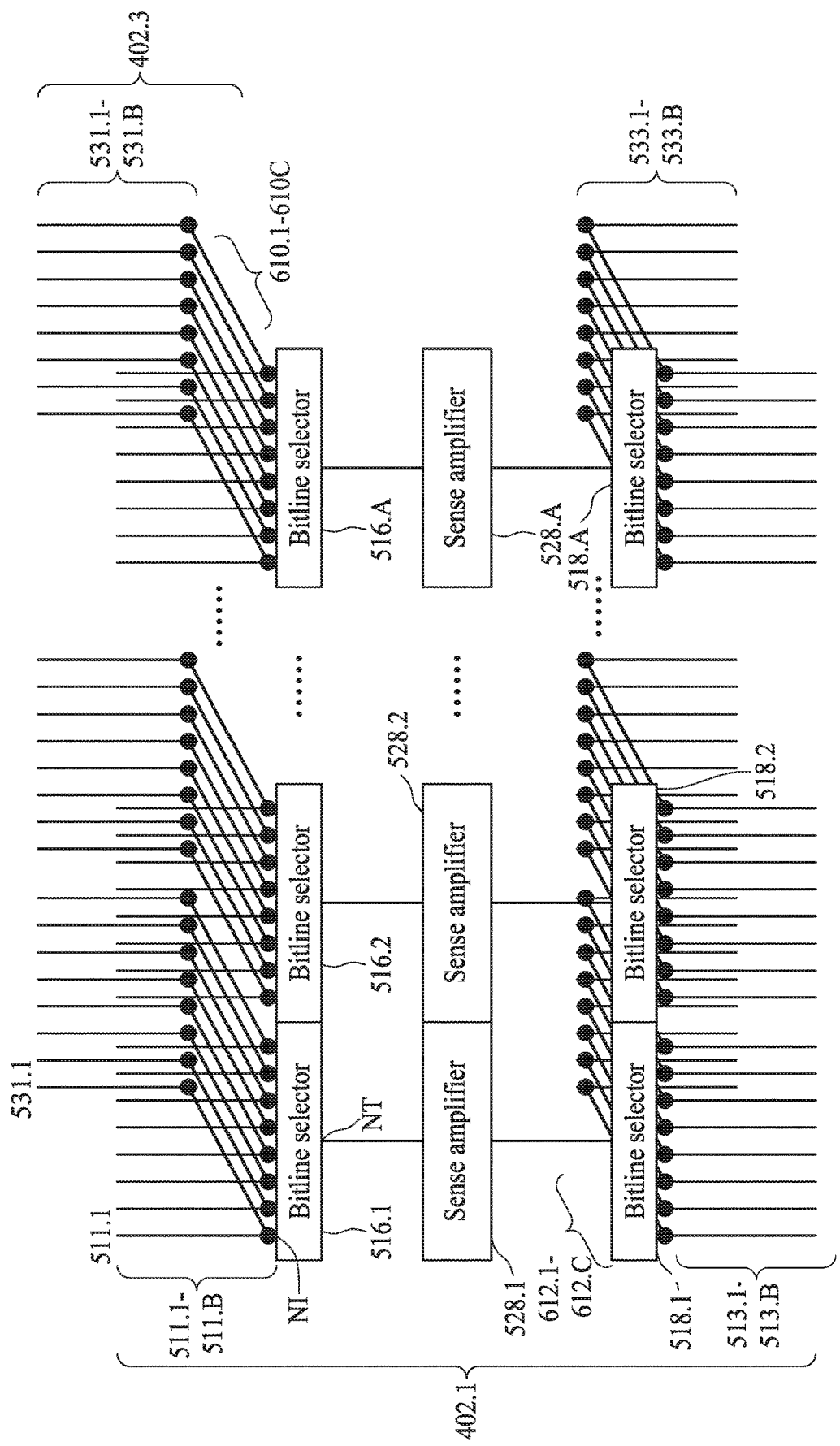
FIG. 6 is a diagram illustrating exemplary bitline segment connection between different circuit layers shown in FIG. 4 in accordance with some embodiments of the present disclosure.

In some embodiments, bitline segmentation may be applied to circuit layers without column multiplexing. Referring to FIG. 6, exemplary bitline segment connection between different circuit layers shown in FIG. 4 is illustrated in accordance with some embodiments of the present disclosure. The circuit arrangement shown in FIG. 6 is similar to that shown in FIG. 5 except that segmented bitlines shown in FIG. 6 are electrically connected before column multiplexing. Similar to the circuit arrangement FIG. 5, the circuit layers 402.2 and 402.4 are not shown in FIG. 6 for illustration and simplicity. It should be noted that the description that follows can be used to electrically connect segmented bitlines disposed on any two of the circuit layers 402.1-402.4 shown in FIG. 4. Also, the description that follows can be used to electrically connect segmented bitlines disposed on any two of the circuit layers 202.1-202.N as described above in FIG. 2A.

In the present embodiment, the circuit layer 402.3 is electrically connected to the circuit layer 402.1 through conductive through via structures 610.1-610.C and 612.1-612.C, where C is a positive integer greater than one. One of the conductive through via structures 610.1-610.C can represent an embodiment of the conductive through via structure 410.1 shown in FIG. 4. One of the conductive through via structures 612.1-612.C can represent an embodiment of the conductive through via structure 410.2 shown in FIG. 4.

As shown in FIG. 6, bitline segments of a same bitline are connected through a corresponding conductive through via structure before bitline selection. Each bitline selector includes a plurality of input terminals and an output terminal. The input terminals are electrically connected to a plurality of conductive through via structures respectively, and the bitline selector is configured to couple one of the input terminals to the output terminal. For example, the bitline segment 511.1 and the bitline segment 531.1 can be segmented from a same bitline with the use of the conductive through via structure 610.1. When the bitline is selected, the bitline selector 516.1 can be configured to couple an input terminal NI to an output terminal NT since the bitline segment 511.1, the bitline segment 531.1 and the conductive through via structure 610.1 are electrically connected at the input terminal NI. The bitlines associated with the bitline segment 513.1-513.A and 533.1-533.A can be selected in a similar/identical manner.

As an input terminal of a bitline selector of the circuit layer 402.1 can be electrically connected to the circuit layer 402.3 through a conductive through via structure, a sensor amplifier of the circuit layer 402.1, coupled to an output terminal of the bitline selector, can be electrically connected to the circuit layer 402.3 with the use of bitline selection. For example, the sense amplifier 528.1 of the circuit layer 402.1 can be electrically connected to a bitline segment on the circuit layer 402.3, such as the bitline segment 531.1, through the bitline selector 536.1 and a corresponding conductive through via structure. As a result, the sense amplifier 528.1 can receive data outputted from the circuit layer 402.3.

In some embodiments, the bitline segment connection between two circuit layers shown in FIG. 6 can be used to electrically connect one circuit layer including write driver circuits, such as the circuit layer 402.2 shown in FIG. 4, to another circuit layer. For example, a bitline segment 420.21/420.22 disposed on the circuit layer 402.2 shown in FIG. 4 can be electrically connected to a bitline segment disposed on a different circuit layer shown in FIG. 4 before column multiplexing. In these embodiments, the bitline segment connection between the circuit layer 402.2 and the different circuit layer is similar/identical to that shown in FIG. 6 except that the sense amplifiers shown in FIG. 6 are replaced with the write driver circuits.

In some embodiments, the bitline segment connection between two circuit layers shown in FIG. 6 can be used to electrically connect one circuit layer including pull-down circuits, such as the circuit layer 402.3/403.4 shown in FIG. 4, to another circuit layer. For example, a bitline segment 420.31/420.32 disposed on the circuit layer 402.3 shown in FIG. 4 can be electrically connected to a bitline segment disposed on a different circuit layer shown in FIG. 4 before column multiplexing. In these embodiments, the bitline segment connection between the circuit layer 402.3 and the different circuit layer is similar/identical to that shown in FIG. 6 except that the sense amplifiers shown in FIG. 6 are replaced with the pull-down circuits.

It should be noted that the bitline segment connection between two circuit layers shown in FIG. 6 can be used to electrically connect other types of segmented signal lines, such as segmented source lines, disposed on any two of the circuit layers 402.1-402.4 shown in FIG. 4, or the circuit layers 202.1-202.N as described above in FIG. 2A, without departing from the scope of the present disclosure.

Figure 7:
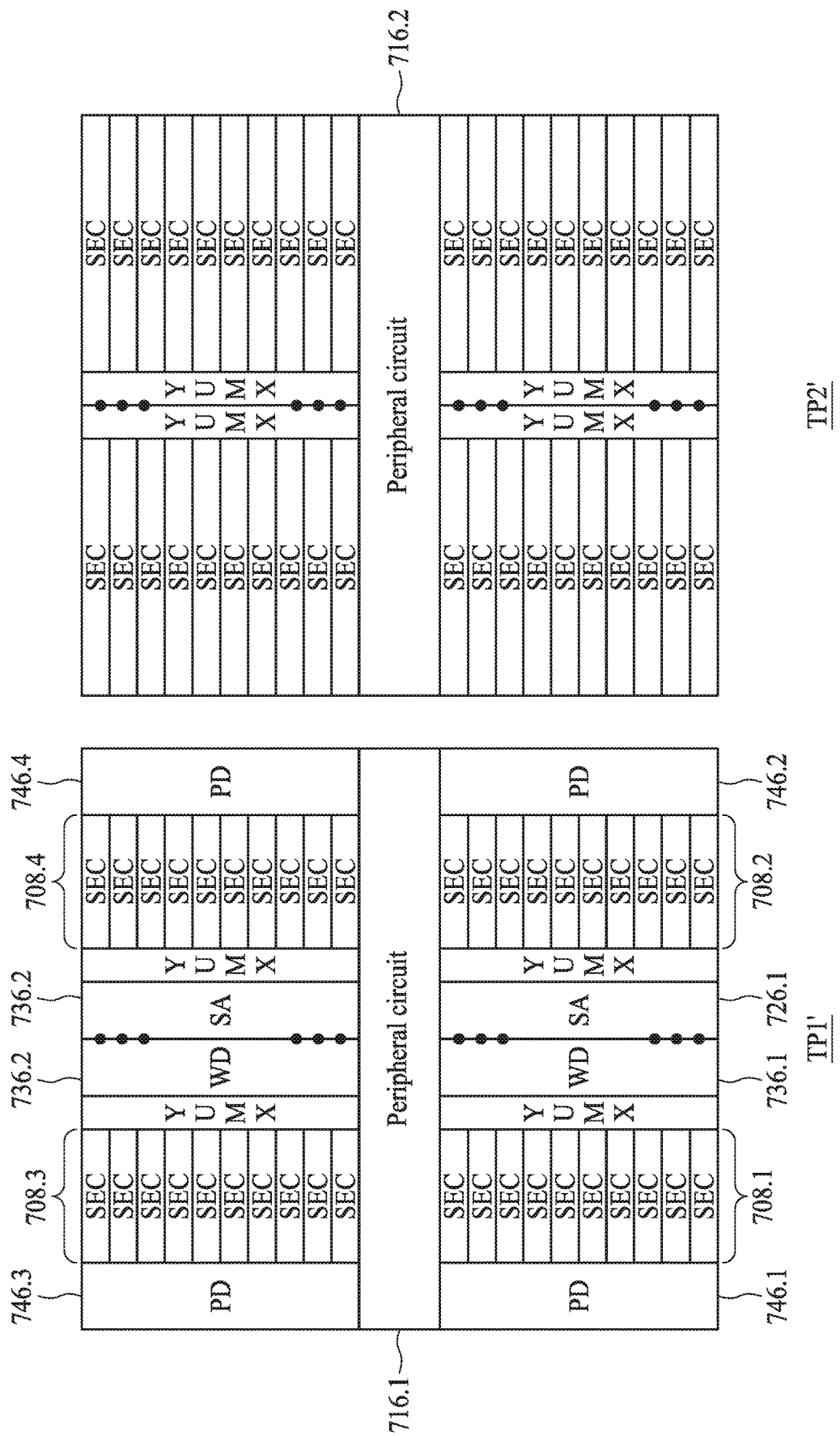
FIG. 7 illustrates circuit layers having different layouts in accordance with some embodiments of the present disclosure.

In some embodiments, amplifier circuit blocks, write driver circuit blocks and pull-down circuit blocks can be disposed on a same circuit layer of a 3D memory device. Referring firstly to FIG. 7, circuit layers having different layouts TP1' and TP2' are illustrated in accordance with some embodiments of the present disclosure. Each of the circuit layers shown in FIG. 7 can represent an embodiment of at least one of the circuit layers 202.1-202.N shown in FIG. 2A. Also, each of the circuit layers shown in FIG. 7 can be implemented to include a portion of the memory array layer 106 shown in FIG. 1.

The circuit layer having the layout TP1' may include a plurality of memory cell arrays 708.1-708.4, a peripheral circuit block 716.1, column selection logic or a plurality of column multiplexer circuit blocks (YMUX), a plurality of amplifier circuit blocks (SA) 726.1 and 726.2, a plurality of write driver circuit blocks (WD) 736.1 and 736.2, and a plurality of pull-down circuit blocks (PD) 746.1-746.4. Filled dots in the center region of the layout TP1' represent a portion of conductive through via structures penetrating the circuit layer having the layout TP1', wherein the conductive through via structures can be implemented by TSVs and serve as global I/O lines.

Each of the memory cell arrays 708.1-708.4, also referred to a memory bank, includes a plurality of memory sections (SEC). Each memory section includes a plurality of memory cells (not shown in FIG. 7) arranged in rows and columns. Regarding each memory cell array, memory cells in a same row are coupled to a same wordline (not shown in FIG. 7), and memory cells in a same column are coupled to a same bitline segment (not shown in FIG. 7) or a same bitline. The peripheral circuit 716.1 can be implemented to include the pre-decoder circuits and the wordline driver circuits as illustrated in FIG. 1.

Each column multiplexer circuit block may include one or more column multiplexer circuits. Each column multiplexer circuit is configured to couple one of bitline segments in a memory section to a corresponding amplifier circuit within an amplifier circuit block, allowing each memory section to output one data bit at a time and therefore increasing the memory array efficiency. The amplifier circuit blocks 726.1 and 726.2 can be implemented to include the amplifier circuit blocks shown in FIG. 1. Each amplifier circuit block can include one or more amplifier circuits such as sense amplifiers. In some embodiments, the circuit layer having the layout TP1' can employ an open bitline architecture, where a pair of bitlines includes two bitlines located on either side of a shared sense amplifier. In some other embodiments, the circuit layer having the layout TP1' can employ a folded bitline architecture, where a pair of bitlines sharing a same sense amplifier includes adjacent two bitlines.

The write driver circuit blocks 736.1 and 736.2 can be implemented to include the write driver circuit blocks shown in FIG. 1. Each write driver circuit block can include one or more write driver circuits. Each write driver circuit can write data into a memory cell in a memory section through a corresponding column multiplexer circuit in a column multiplexer circuit block. In some embodiments, each write driver circuit can include a write circuit and a write driver configured to write data into memory cells.

The pull-down circuit blocks 746.1-746.4 can be implemented to include the pull-down circuit blocks shown in FIG. 1. Each pull-down circuit block can include one or more pull-down circuits, such as bias circuits and pull-down transistors.

The floor plan of the circuit layer having the layout TP2' is similar/identical to that of the circuit layer having the layout TP1' except that amplifier circuit blocks, write driver circuit blocks and pull-down circuit blocks can be omitted. Filled dots in the center region of the layout TP2' represent a portion of conductive through via structures penetrating the circuit layer having the layout TP2', wherein the conductive through via structures can be implemented by TSVs and serve as global I/O lines. In addition, the peripheral circuit 716.2 can be implemented to include the pre-decoder circuits and the wordline driver circuits as illustrated in FIG. 1.

Figure 8:
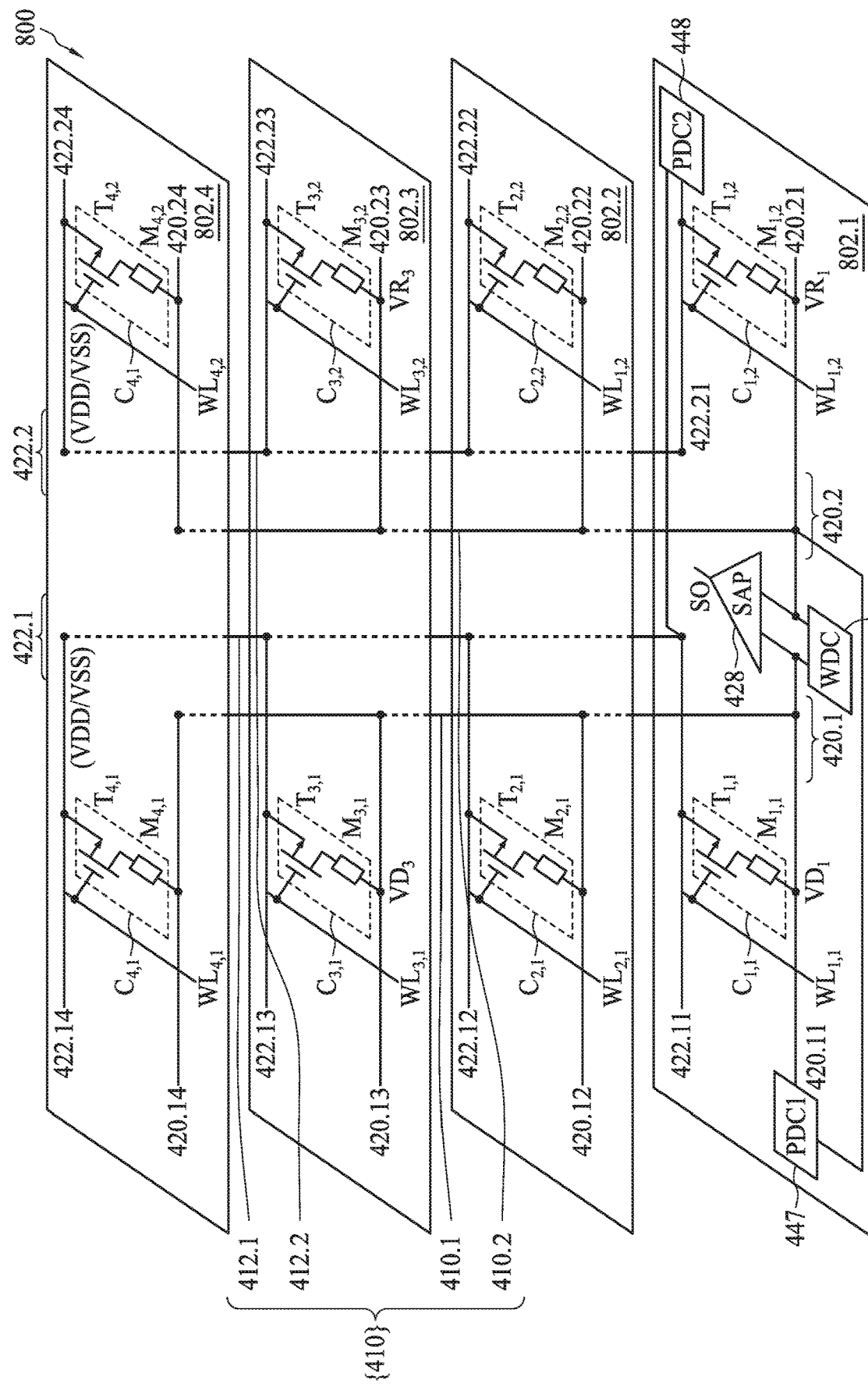
FIG. 8 illustrates a memory device having a plurality of circuit layers employing the different layouts shown in FIG. 7 in accordance with some embodiments of the present disclosure.

The circuit layers shown in FIG. 7 may be stacked on top of each other, or disposed one above another, to form a 3D memory device or a 3D memory array. Referring to FIG. 8, a memory device 800 having a plurality of circuit layers employing the different layouts TP1'-TP2' shown in FIG. 7 is illustrated in accordance with some embodiments of the present disclosure. The memory device 800 can represent an embodiment of the memory device 200 shown in FIG. 2A. In the present embodiment, the memory device 800 can include four circuit layers 802.1-802.4, which are electrically connected through a plurality of conductive through via structures {410}. The circuit layer 802.1 can employ the layout TP1' shown in FIG. 7. Each of the circuit layers 802.2-802.4 can employ the layout TP2' shown in FIG. 7.

Circuit structure and access operation of the memory device 800 can be similar to that of the memory device 400 except that amplifier circuit blocks, write driver circuit blocks and pull-down circuit blocks of the memory device 800 are disposed on the same circuit layer 802.1. By way of example but not limitation, the circuit layer 802.1 can include the sense amplifier (labeled SAP) 428, the write driver circuit (labeled WDC) 438, the pull-down circuit (labeled PDC1) 447 and the pull-down circuit (labeled PDC2) 448 shown in FIG. 4. In some embodiments, bitline segments of any two of the circuit layers 802.1-802.4 can be electrically connected using the bitline segment connection shown in FIG. 5. In some other embodiments, bitline segments of any two of the circuit layers 802.1-802.4 can be electrically connected using the bitline segment connection shown in FIG. 6. Please note that when the bitline segment connection shown in FIG. 6 is employed in the circuit layers 802.1-802.4, the column multiplexer circuit blocks of the circuit layer 802.2-802.4 may be removed.

Additionally or alternatively, in some embodiments, it is possible to dispose at least one of the circuit layers 402.1-402.4 shown in FIG. 4 and at least one of the circuit layers 802.1-802.4 shown in FIG. 8 one above another to form a memory device. Those skilled in the art should recognize that such equivalent constructions do not depart from the spirit and scope of the present disclosure.

Figure 9:
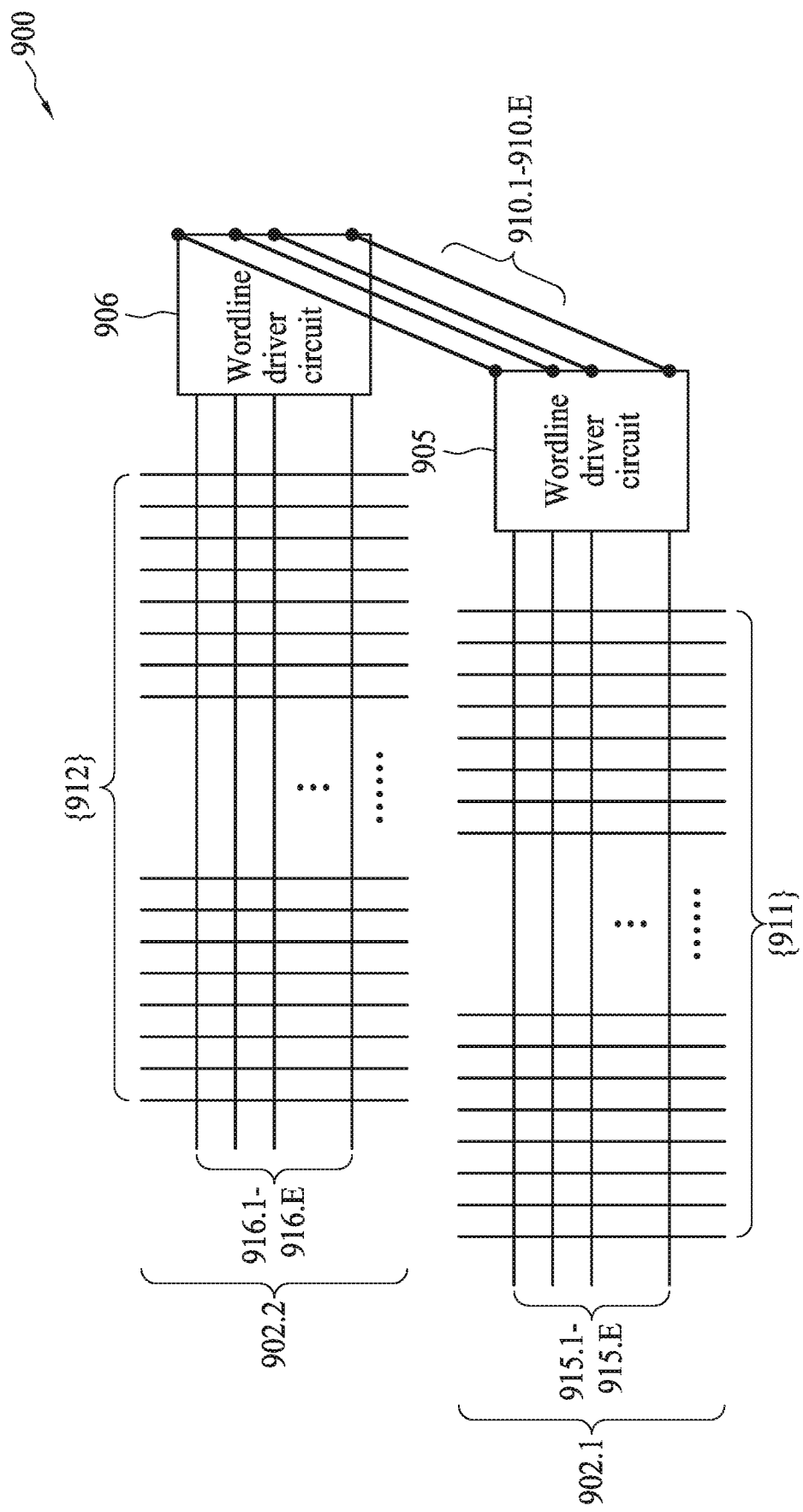
FIG. 9 illustrates exemplary wordline driving schemes associated with different circuit layers according to some embodiments of the present disclosure.
Figure 10:
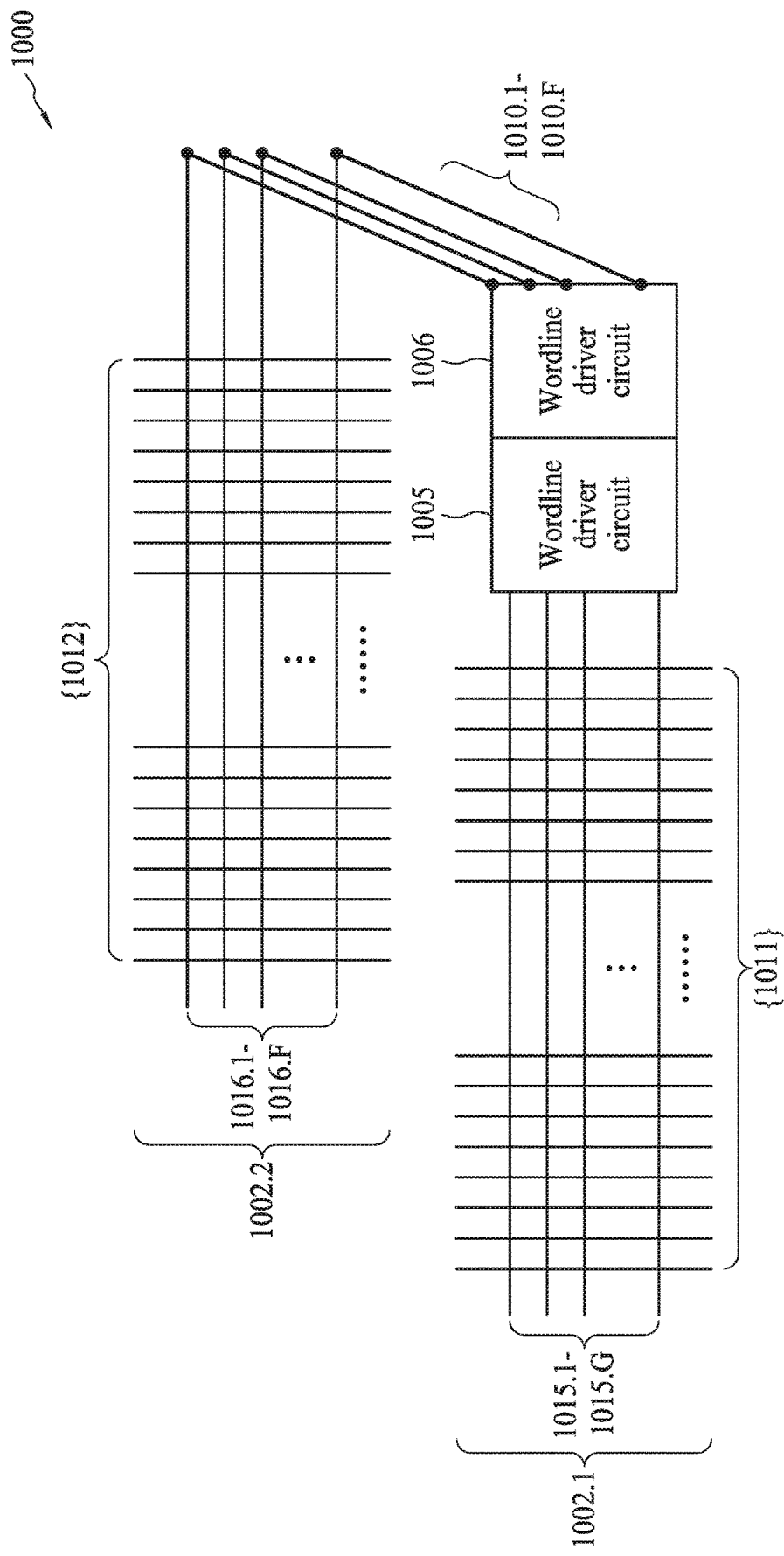
FIG. 10 illustrates exemplary wordline driving schemes associated with different circuit layers according to some embodiments of the present disclosure.

In some embodiments, conductive through via structures in a 3D memory device may be used for transmitting wordline address signals between different circuit layers. FIG. 9 and FIG. 10 illustrate exemplary wordline driving schemes associated with different circuit layers according to some embodiments of the present disclosure. The description that follows can be used to drive wordlines disposed on different circuit layers, such as the circuit layers 202.1-202.N shown in FIG. 2A, the circuit layers 402.1-402.4 shown in FIG. 4 and the circuit layers 802.1-802.4 shown in FIG. 8.

Referring to FIG. 9, a memory device 900 having a plurality of circuit layers disposed one above another are illustrated in accordance with some embodiments of the present disclosure. The memory device 900 can represent an embodiment of the memory device 200 shown in FIG. 2A. In the present embodiment, the memory device 900 includes a plurality of circuit layers 902.1 and 902.2, a plurality of conductive through via structures 910.1-910.E (E is an integer greater than one) penetrating through the circuit layers 902.1 and 902.2, a plurality of bitline segments {911} and {912}, and a plurality of wordlines 915.1-915.E and 916.1-916.E. Each of the circuit layers 902.1 and 902.2 can represent an embodiment of any circuit layer as described above. The conductive through via structures 910.1-910.E can represent an embodiment of a portion of the conductive through via structures 210.1-210.M as illustrated in FIG. 2A.

The bitline segments {911} and the wordlines 915.1-915.E are disposed on the circuit layer 902.1, and the bitline segments {912} and the wordlines 916.1-916.E are disposed on the circuit layer 902.2. Each of the circuit layers 902.1 and 902.2 can include a wordline driver circuit, i.e. one of wordline driver circuits 905 and 906. The wordline driver circuit can represent an embodiment of a portion of a wordline driver circuit block shown in FIG. 1. The wordline driver circuit 905 is configured to drive the wordlines 915.1-915.E disposed on the circuit layer 902.1. The wordline driver circuit 906 is configured to drive the wordlines 916.1-916.E disposed on the circuit layer 902.2. In the present embodiment, the conductive through via structures 910.1-910.E are connected between the wordline driver circuits 905 and 906, such that the wordline driver circuits 905 and 906 can be configured to share a common wordline address input, e.g. pre-decoded or decoded wordline addresses, on the conductive through via structures 910.1-910.E.

In some embodiments, wordlines disposed on one circuit layer may be driven by a wordline driver circuit of another circuit layer. Referring to FIG. 10, a memory device 1000 having a plurality of circuit layers disposed one above another are illustrated in accordance with some embodiments of the present disclosure. The memory device 1000 can represent an embodiment of the memory device 200 as illustrated in FIG. 2A. In this embodiment, the memory device 1000 includes a plurality of circuit layers 1002.1 and 1002.2, a plurality of conductive through via structures 1010.1-1010.F penetrating through the circuit layers 1002.1 and 1002.2, a plurality of bitline segments {1011} and {1012}, and a plurality of wordlines 1015.1-1015.G and 1016.1-1016.F. Each of F and G is an integer greater than one. Each of the circuit layers 1002.1 and 1002.2 can represent an embodiment of any circuit layer as described above. The conductive through via structures 1010.1-1010.F can represent an embodiment of a portion of the conductive through via structures 210.1-210.M as illustrated in FIG. 2A.

The bitline segments {1011} and the wordlines 1015.1-1015.G are disposed on the circuit layer 1002.1, and the bitline segments {1012} and the wordlines 1016.1-1016.F are disposed on the circuit layer 1002.2. The circuit layer 1002.1 can include a plurality of wordline driver circuits 1005 and 1006, which can represent an embodiment of a portion of a wordline driver circuit block shown in FIG. 1. The wordline driver circuit 1005 is configured to drive the wordlines 1015.1-1015.G disposed on the circuit layer 1002.1. Since the conductive through via structures 1010.1-1010.F are electrically connected between the wordline driver circuit 1006 and the wordlines 1016.1-1016.F disposed on the second circuit layer 1002.2, the wordline driver circuit 1006 can be configured to drive the wordlines 1016.1-1016.F according to a wordline address input on the conductive through via structures 1010.1-1010.F.

In some embodiments, it is possible to dispose first circuit layers, which are implemented by the circuit layers 902.1 and 902.2 shown in FIG. 9, and second circuit layers, which are implemented by the circuit layers 1002.1 and 1002.2 shown in FIG. 10, to form a memory device having stacked circuit layers. Those skilled in the art should recognize that such equivalent constructions do not depart from the spirit and scope of the present disclosure.

With the use of conductive through via structures, circuit blocks of the memory peripheral circuitry shown in FIG. 1 can be partitioned into different circuit layers, thereby forming a 3D memory device having increased array efficiency and reduced parasitic resistance.

Figure 11:
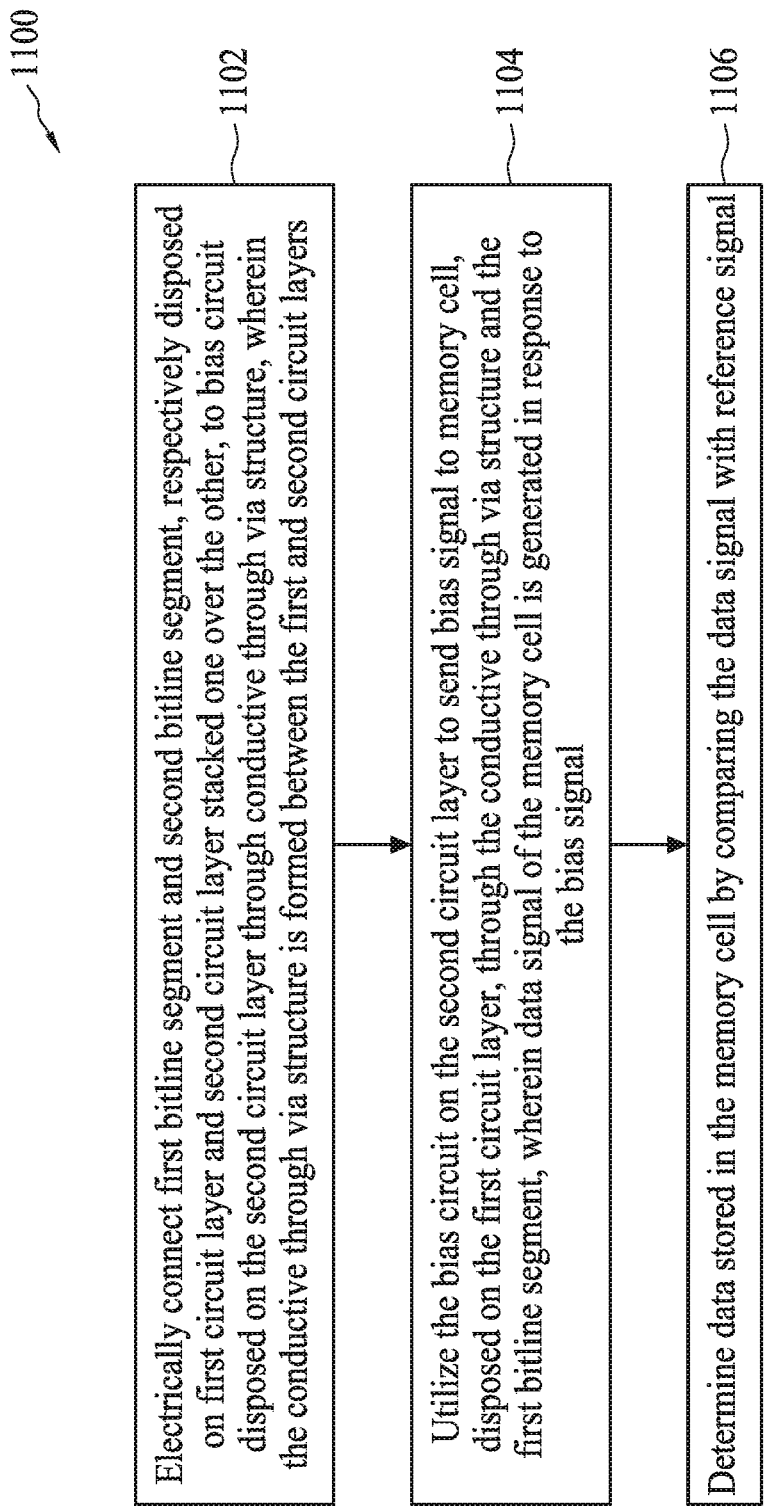
FIG. 11 is a flow chart of an exemplary method for operating a memory device in accordance with some embodiments of the present disclosure.

FIG. 11 is a flow chart of an exemplary method for operating a memory device according to an exemplary embodiment of the present disclosure. For illustrative purposes, the method 1100 is described with reference to the memory device 400 shown in FIG. 4. Those skilled in the art will recognize that the method 1100 can be employed in other types of memory devices having segmented signal lines, such as the memory device 200 shown in FIG. 2A and the memory device 800 shown in FIG. 8, without departing from the scope of the present disclosure. Additionally, in some embodiments, other operations in the method 1100 can be performed and operations of the method 1100 can be performed in a different order and/or vary.

At operation 1102, a first bitline segment and a second bitline segment of a selected bitline, respectively disposed on a first circuit layer and a second circuit layer of the memory device stacked one over the other, is electrically connected to a bias circuit disposed on the second circuit layer through a conductive through via structure. The conductive through via structure is formed between the first circuit layer and the second circuit layer. For example, during a read operation where data stored in the memory cell $C_{1,1}$ on the circuit layer 402.1 is to be read, the bitline 420.1 is selected such that the bitline segments 420.11-420.41 are electrically connected to the pull-down circuit 447 on the circuit layer 402.3 through the conductive through via structures 412.1

At operation 1104, the bias circuit on the second circuit layer is utilized to send a bias signal to a memory cell, disposed on the first circuit layer, through the conductive through via structure and the first bitline segment coupled to the memory cell. A data signal of the memory cell is generated in response to the bias signal. For example, during a read operation where data stored in the memory cell $C_{1,1}$ on the circuit layer 402.1 is to be read, the pull-down circuit 447 on the circuit layer 402.3 is configured to send a bias signal, such as a current signal or a voltage signal, to the memory cell $C_{1,1}$ through the conductive through via structure 412.1 and the bitline segment 420.11. The voltage signal $VD_1$ of the memory cell $C_{1,1}$ is generated in response to the bias signal.

At operation 1106, data stored in the memory cell is determined by comparing the data signal with a reference signal. For example, during a read operation where data stored in the memory cell $C_{1,1}$ on the circuit layer 402.1 is to be read, a resistance state of the MTJ $M_{1,1}$ can be determined by comparing the voltage signal $VD_1$ and the voltage signal $VR_1$.

In some embodiments, the first bitline segment and the second bitline segment can be electrically connected to the bias circuit by coupling each of the first bitline segment and the second bitline segment to the conductive through via structure. For example, the memory device 400 may employ bitline segment connection shown in FIG. 5 during a memory access operation. However, in some other embodiments, segmented bitlines can are electrically connected before column multiplexing. For example, the memory device 400 may employ bitline segment connection shown in FIG. 6 during a memory access operation.

By connecting memory cells in different circuit layers through conductive through via structures, a bitline can be segmented into multiple bitline segments respectively disposed on the different circuit layers, thus providing a 3D memory device having more memory cells per bitline and reduced parasitic resistance. In addition, circuit blocks of memory peripheral circuitry can be partitioned into different circuit layers of the 3D memory device in different ways, increasing design flexibility and reducing a circuit area of a circuit layer.

Some embodiments described herein may include a memory device that includes a plurality of circuit layers, a plurality of first conductive through via structures and a plurality of bitlines. The circuit layers are disposed one above another, and each circuit layer includes one or more memory cell arrays. The first conductive through via structures penetrate though the circuit layers. Each bitline includes a plurality of bitline segments disposed on the circuit layers respectively, the bitline segments are electrically connected through one of the first conductive through via structures, and each bitline segment is coupled to a plurality of memory cells of a memory cell array of a circuit layer where the bitline segment is disposed.

Some embodiments described herein may include a memory device that includes a plurality of circuit layers, a plurality of conductive through via structure, a data bitline and a reference bitline. The circuit layers are disposed one above another, each circuit layer includes one or more memory cell arrays, and a first circuit layer of the circuit layers includes an amplifier circuit. The conductive through via structures penetrate though the circuit layers, and the conductive through via structures include a first conductive through via structure and a second conductive through via structure. The data bitline has a plurality of data bitline segments disposed on the circuit layers respectively, the data bitline segments are electrically connected through the first conductive through via structure and sharing the amplifier circuit, and the first conductive through via structure is coupled to a first input terminal of the amplifier circuit of the first circuit layer. The reference bitline has a plurality of reference bitline segments disposed on the circuit layers respectively, the reference bitline segments are electrically connected through the second conductive through via structure and sharing the amplifier circuit, and the second conductive through via structure is coupled to a second input terminal of the amplifier circuit of the first circuit layer.

Some embodiments described herein may include a method for operating a memory device. The method includes electrically connecting a first bitline segment and a second bitline segment of a selected bitline, respectively disposed on a first circuit layer and a second circuit layer of the memory device stacked one over the other, to a bias circuit disposed on the second circuit layer through a conductive through via structure, the conductive through via structure being formed between the first circuit layer and the second circuit layer; utilizing the bias circuit on the second circuit layer to send a bias signal to a memory cell, disposed on the first circuit layer, through the conductive through via structure and the first bitline segment coupled to the memory cell, a data signal of the memory cell being generated in response to the bias signal; and determining data stored in the memory cell by comparing the data signal with a reference signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of circuit layers disposed one above another, each circuit layer comprising one or more memory cell arrays;
a plurality of conductive through via structures penetrating though the circuit layers; and
a plurality of bitlines, each bitline comprising a plurality of bitline segments disposed on the circuit layers respectively, the bitline segments being electrically connected through one of the conductive through via structures, each bitline segment being coupled to a plurality of memory cells of a memory cell array of a circuit layer where the bitline segment is disposed;
wherein the circuit layers comprise a first circuit layer and a second circuit layer; the first circuit layer comprises a first bitline selector, and the second circuit layer comprises a second bitline selector; the first bitline selector is configured to couple one bitline segment selected from among a first set of bitline segments disposed on the first circuit layer to a first conductive through via structure of the conductive through via structures, and the second bitline selector is configured to couple one bitline segment selected from among a second set of bitline segments disposed on the second circuit layer to the first conductive through via structure.

2. The memory device of claim 1, wherein the bitline segment selected from among the first set of bitline segments and the bitline segment selected from among the second set of bitline segments are segmented from a same bitline.

3. The memory device of claim 1, wherein the first circuit layer further comprises:
an amplifier circuit, having an input terminal coupled to an output terminal of the first bitline selector, wherein the output terminal of the first bitline selector is electrically connected to an output terminal of the second bitline selector through the first conductive through via structure.

4. The memory device of claim 1, wherein an output terminal of the first bitline selector is electrically connected to an output terminal of the second bitline selector through the first conductive through via structure; the first circuit layer further comprises:
a write driver circuit, coupled to the output terminal of the first bitline selector, the write drive circuit being configured to drive a data signal to the bitline segment selected from among the second set of bitline segments through the first conductive through via structure.

5. The memory device of claim 1, wherein an output terminal of the first bitline selector is electrically connected to an output terminal of the second bitline selector through the first conductive through via structure; the first circuit layer further comprises:
a bias circuit, coupled to the output terminal of the first bitline selector, the bias circuit being configured to send a bias signal to the bitline segment selected from among the second set of bitline segments through the first conductive through via structure.

6. The memory device of claim 1, wherein the first circuit layer comprises a first wordline driver circuit, and the second circuit layer comprises a second wordline driver circuit; second conductive through via structures of the conductive through via structures are electrically connected between the first wordline driver circuit and the second wordline driver circuit; the first wordline driver circuit and the second wordline driver circuit are configured to share a common wordline address input on the second conductive through via structures.

7. The memory device of claim 1, wherein the first circuit layer further comprises a wordline driver circuit, and the memory device further comprises:
a plurality of wordlines disposed on the second circuit layer, wherein second conductive through via structures of the conductive through via structures are electrically connected between the wordline driver circuit of the first circuit layer and the wordlines disposed on the second circuit layer; the wordline driver circuit of the first circuit layer is configured to drive the wordlines disposed on the second circuit layer according to a wordline address input on the second conductive through via structures.

8. The memory device of claim 1, wherein at least one of the conductive through via structures comprises a through-silicon via.

9. A memory device, comprising:
a plurality of circuit layers disposed one above another, each circuit layer comprising one or more memory cell arrays;
a plurality of first conductive through via structures penetrating though the circuit layers; and
a plurality of bitlines, each bitline comprising a plurality of bitline segments disposed on the circuit layers respectively, the bitline segments being electrically connected through one of the first conductive through via structures, each bitline segment being coupled to a plurality of memory cells of a memory cell array of a circuit layer where the bitline segment is disposed;
wherein the circuit layers comprise a first circuit layer and a second circuit layer; bitline segments disposed on the first circuit layer are electrically connected to bitline segments disposed on the second circuit layer through the first conductive through via structures, respectively; the first circuit layer comprises a bitline selector, and the bitline selector comprises a plurality of input terminals and an output terminal; the input terminals are electrically connected to the first conductive through via structures respectively; the bitline selector is configured to select one from among the input terminals, and couple the selected input terminal to the output terminal.

10. The memory device of claim 9, wherein the first circuit layer further comprises:
an amplifier circuit, having an input terminal coupled to the output terminal of the bitline selector.

11. The memory device of claim 9, wherein the first circuit layer further comprises:
a write driver circuit, coupled to the output terminal of the bitline selector, the write drive circuit being configured to drive a data signal to a bitline segment disposed on the second circuit layer, wherein the bitline segment is coupled to the selected input terminal of the bitline selector through a corresponding first conductive through via structure.

12. The memory device of claim 9, wherein the first circuit layer further comprises:
a bias circuit, coupled to the output terminal of the bitline selector, the bias circuit being configured to send a bias signal to a bitline segment disposed on the second circuit layer, wherein the bitline segment is coupled to the selected input terminal of the bitline selector through a corresponding first conductive through via structure.

13. The memory device of claim 9, wherein the first circuit layer comprises a first wordline driver circuit, and the second circuit layer comprises a second wordline driver circuit; the memory device further comprises:
a plurality of second conductive through via structures, penetrating through the circuit layers, and electrically connected between the first wordline driver circuit and the second wordline driver circuit, wherein the first wordline driver circuit and the second wordline driver circuit are configured to share a common wordline address input on the second conductive through via structures.

14. The memory device of claim 9, wherein the first circuit layer further comprises
a wordline driver circuit, and the memory device further comprises:
a plurality of wordlines disposed on the second circuit layer; and
a plurality of second conductive through via structures, penetrating through the circuit layers, and electrically connected between the wordline driver circuit of the first circuit layer and the wordlines disposed on the second circuit layer, wherein the wordline driver circuit of the first circuit layer is configured to drive the wordlines disposed on the second circuit layer according to a wordline address input on the second conductive through via structures.

15. The memory device of claim 9, wherein the second circuit layer further comprises a wordline driver circuit, and the memory device further comprises:
a plurality of wordlines disposed on the first circuit layer; and
a plurality of second conductive through via structures, penetrating through the circuit layers, and electrically connected between the wordline driver circuit of the second circuit layer and the wordlines disposed on the first circuit layer, wherein the wordline driver circuit of the second circuit layer is configured to drive the wordlines disposed on the first circuit layer according to a wordline address input on the second conductive through via structures.

16. The memory device of claim 9, wherein at least one of the first conductive through via structures comprises a through-silicon via.

17. A method for operating a memory device, comprising:
activating a first wordline and a second wordline, wherein the memory device comprises a first circuit layer and a second circuit layer stacked one over the other, and each of the first wordline and the second wordline is disposed on the first circuit layer; a first signal of a first memory cell is generated on a first bitline in response to activation of the first wordline, and the first memory cell is coupled to the first wordline and the first bitline; a second signal of a second memory cell is generated on a second bitline in response to activation of the second wordline, and the second memory cell is coupled to the second wordline and the second bitline;
selecting the first bitline by coupling each of a first bitline segment and a second bitline segment of the first bitline to a first input terminal of an amplifier circuit on the second circuit layer through a first conductive through via structure, wherein the first signal of the first memory cell is sent to the first input terminal in response to selection of the first bitline; the first bitline segment and the second bitline are disposed on the first circuit layer and the second circuit layer respectively, and the first conductive through via structure is formed between the first circuit layer and the second circuit layer;
selecting the second bitline by coupling each of a third bitline segment and a fourth bitline segment of the second bitline to a second input terminal of the amplifier circuit through a second conductive through via structure, wherein the second signal of the second memory cell is sent to the second input terminal in response to selection of the second bitline; the third bitline segment and the fourth bitline are disposed on the first circuit layer and the second circuit layer respectively, and the second conductive through via structure is formed between the first circuit layer and the second circuit layer; and
generating an output signal of the amplifier circuit according to the first signal and the second signal.

18. The method of claim 17, wherein coupling each of the first bitline segment and the second bitline segment of the first bitline to the first input terminal through the first conductive through via structure comprises:
utilizing a first bitline selector to select the first bitline segment from among a first set of bitline segments on the first circuit layer, and couple the first bitline segment to an output terminal of the first bitline selector; and
utilizing a second bitline selector to select the second bitline segment from among a second set of bitline segments on the second circuit layer, and couple the second bitline segment to an output terminal of the second bitline selector, wherein the output terminal of the first bitline selector is electrically connected to the output terminal of the second bitline selector through the first conductive through via structure.

19. The method of claim 17, wherein coupling each of the first bitline segment and the second bitline segment of the first bitline to the first input terminal through the first conductive through via structure comprises:
- utilizing a bitline selector on the second circuit layer to select one of a set of input terminals, and couple the selected input terminal of the bitline selector to an output terminal of the bitline selector, wherein the selected input terminal of the bitline selector is electrically connected to the second bitline segment, and is further electrically connected to the first bitline segment through the first conductive through via structure.

20. The method of claim 17, wherein generating the output signal of the amplifier circuit according to the first signal and the second signal comprises:
- generating the output signal by comparing the first signal with the second signal.

* * * * *